US007884681B1

(12) United States Patent
Khlat et al.

(10) Patent No.: US 7,884,681 B1
(45) Date of Patent: Feb. 8, 2011

(54) RADIO FREQUENCY POWER AMPLIFIER IMPROVEMENTS USING PRE-DISTORTION OF AN AMPLITUDE MODULATION POWER SUPPLY

(75) Inventors: Nadim Khlat, Midi-Pyrenees (FR); Ruediger Bauder, Feldkirchen-Westerham (DE); David Reed, Westminster, CO (US); Baker P. Scott, Boulder, CO (US)

(73) Assignee: RF Micro Devices, Inc., Greensboro, NC (US)

( * ) Notice: Subject to any disclaimer, the term of this patent is extended or adjusted under 35 U.S.C. 154(b) by 197 days.

(21) Appl. No.: 12/112,006

(22) Filed: Apr. 30, 2008

(51) Int. Cl.
*H03C 1/00* (2006.01)
*H03C 1/02* (2006.01)
*H03C 1/06* (2006.01)
(52) U.S. Cl. .................. 332/149; 332/159; 332/160
(58) Field of Classification Search ......... 332/103–105, 332/144–146, 151–154, 159–162; 330/10
See application file for complete search history.

(56) References Cited

U.S. PATENT DOCUMENTS 6,043,707 A * 3/2000 Budnik .................. 330/10
2004/0266366 A1* 12/2004 Robinson et al. ............. 455/91

* cited by examiner

*Primary Examiner*—David Mis
(74) *Attorney, Agent, or Firm*—Withrow & Terranova, P.L.L.C.

(57) ABSTRACT

Embodiments of the present invention include amplitude-modulated or polar-modulated radio frequency (RF) power amplifier circuitry, in which an envelope power supply input to an RF power amplifier is powered by a pre-distorted amplitude modulation (AM) power supply. The pre-distorted AM power supply receives an AM signal, which is then pre-distorted and amplified to provide an AM power supply signal to the RF power amplifier. The pre-distortion of the AM signal is used to improve the linearity, the efficiency, or both, of the RF power amplifier. The pre-distortion provides a feed-forward system, which may allow use of a reduced bandwidth pre-distorted AM signal to an AM power supply and a reduced bandwidth AM power supply, which may increase efficiency.

30 Claims, 22 Drawing Sheets

FIG. 3 - PRIOR ART

RADIO FREQUENCY POWER AMPLIFIER IMPROVEMENTS USING PRE-DISTORTION OF AN AMPLITUDE MODULATION POWER SUPPLY

RELATED APPLICATIONS

The present application is related to commonly owned and assigned U.S. patent application Ser. No. 11/113,873, filed Apr. 25, 2005, entitled "POWER CONTROL SYSTEM FOR A CONTINUOUS TIME MOBILE TRANSMITTER," which is hereby incorporated herein by reference in its entirety.

FIELD OF THE INVENTION

Embodiments of the present invention relate to amplitude-modulated radio frequency (RF) power amplifiers, including polar-modulated RF power amplifiers that are powered using amplitude-modulated power supplies, which may be used in RF communications systems.

BACKGROUND OF THE INVENTION

As technology progresses, portable devices tend to integrate more features. For example, portable devices may include features associated with personal digital assistants (PDAs), cellular telephones, wireless internet access devices, global positioning system (GPS) receivers, and the like. Such portable devices may support one or more wireless communications protocols, such as third (3G), fourth (4G), or later generation cellular telephone protocols, GPS protocols, wireless fidelity (Wi-Fi) protocols, Bluetooth®, and the like. Some of these protocols may have tight channel spacing that require narrow channel bandwidths and tight restrictions on transmissions of spurious RF signals outside a channel's bandwidth. Often, to meet channel bandwidth requirements and to meet spurious RF emissions requirements, an RF transmitter may need to meet stringent linearity requirements. An RF power amplifier in an RF transmitter may be a major source of non-linearity; therefore, there is a need for an RF power amplifier that meets stringent linearity requirements.

Most portable devices are battery powered and, since battery life is inversely related to power consumption, need to consume as little power as possible to maximize battery life. The RF power amplifier in a wireless portable device may consume a significant portion of the power used by the portable device. One way to reduce power consumption in an RF power amplifier is to improve its efficiency. Some communications protocols, such as those using wideband code division multiple access (WCDMA), may require polar modulation of an RF signal. Polar modulation includes an amplitude modulation (AM) component and a phase modulation (PM) component. To maximize efficiency in an amplitude-modulated or polar-modulated RF power amplifier, an envelope power supply input to the RF power amplifier may be provided by an AM power supply, which may include a switching power supply that tracks, at least to some extent, the amplitude of an amplitude-modulated or polar-modulated RF signal to the RF power amplifier.

Linearity of the RF power amplifier may be degraded when using a constant power supply due to modulation of the gain of the RF power amplifier by the RF envelope, which is associated with AM. The modulation of the gain may produce a gain increase, called gain expansion, a gain decrease, called gain compression, or both. Additionally, the AM power supply must provide adequate headroom for proper operation of the RF power amplifier. In some systems, the bandwidth of an AM signal used to modulate the AM power supply may be about 12 megahertz or more; therefore, for proper tracking, the bandwidth of the AM power supply may need to be about 12 megahertz or more. Such an AM power supply may include a switching power supply and a linear power supply to meet bandwidth requirements; however, linear power supplies are typically less efficient than switching power supplies. Therefore, a 12 megahertz AM power supply may be less efficient than an AM power supply with less bandwidth. Thus, there is a need for RF power amplifier circuitry that includes an amplitude-modulated or polar-modulated RF power amplifier, which is powered from an AM power supply, maximizes efficiency, and meets linearity requirements.

SUMMARY OF THE EMBODIMENTS

Embodiments of the present invention include amplitude-modulated or polar-modulated RF power amplifier circuitry, in which an envelope power supply input to an RF power amplifier is powered by a pre-distorted amplitude modulation (AM) power supply. The pre-distorted AM power supply receives an AM signal, which is then pre-distorted and amplified to provide an AM power supply signal to the RF power amplifier. The pre-distortion of the AM signal is used to improve the linearity, the efficiency, or both, of the RF power amplifier. The pre-distortion provides a feed-forward system, which may allow use of a reduced bandwidth pre-distorted AM signal to an AM power supply and a reduced bandwidth AM power supply, which may increase efficiency.

In one embodiment of the present invention, an AM modulation circuit provides an AM RF signal or a polar-modulated RF signal to the RF power amplifier based on an AM signal. The RF power amplifier is powered by the pre-distorted AM power supply and amplifies the signal from the AM modulation circuit to provide an RF output signal. In addition to pre-distorting the AM signal to an AM power supply, the signal from the AM modulation circuit may also be based on pre-distorting the AM signal. In another embodiment of the present invention, gain measurement circuitry may be used to periodically measure the gain of the RF power amplifier and then provide a gain correction signal to AM gain correction circuitry, which provides a gain-corrected AM signal to the AM modulation circuit to correct for gain variations in the RF power amplifier. Additionally, the gain-corrected signal may be pre-distorted to provide soft-clipping of the signal from the AM modulation circuit to compensate if the gain correction would otherwise drive the RF power amplifier into clipping.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 17A and 17B are graphs illustrating the AM signal and the AM power supply input signal, respectively, according to one embodiment of the present invention.

FIGS. 17A and 17C are graphs illustrating the AM signal and the AM power supply input signal, respectively, according to an alternate embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Embodiments of the present invention include amplitude-modulated or polar-modulated RF power amplifier circuitry, in which an envelope power supply input to an RF power amplifier is powered by a pre-distorted amplitude modulation (AM) power supply. The pre-distorted AM power supply receives an AM signal, which is then pre-distorted and amplified to provide an AM power supply signal to the RF power amplifier. The pre-distortion of the AM signal is used to improve the linearity, the efficiency, or both, of the RF power amplifier. The pre-distortion provides a feed-forward system, which may allow use of a reduced bandwidth pre-distorted AM signal to an AM power supply and a reduced bandwidth AM power supply, which may increase efficiency.

In one embodiment of the present invention, an AM modulation circuit provides an AM RF signal or a polar-modulated RF signal to the RF power amplifier based on an AM signal. The RF power amplifier is powered by the pre-distorted AM power supply and amplifies the signal from the AM modulation circuit to provide an RF output signal. In addition to pre-distorting the AM signal to an AM power supply, the signal from the AM modulation circuit may also be based on pre-distorting the AM signal. In another embodiment of the present invention, gain measurement circuitry may be used to periodically measure the gain of the RF power amplifier and then provide a gain correction signal to AM gain correction circuitry, which provides a gain-corrected AM signal to the AM modulation circuit to correct for gain variations in the RF power amplifier. Additionally, the gain-corrected signal may be pre-distorted to provide soft-clipping of the signal from the AM modulation circuit to compensate if the gain correction would otherwise drive the RF power amplifier into clipping.

Figure 1:
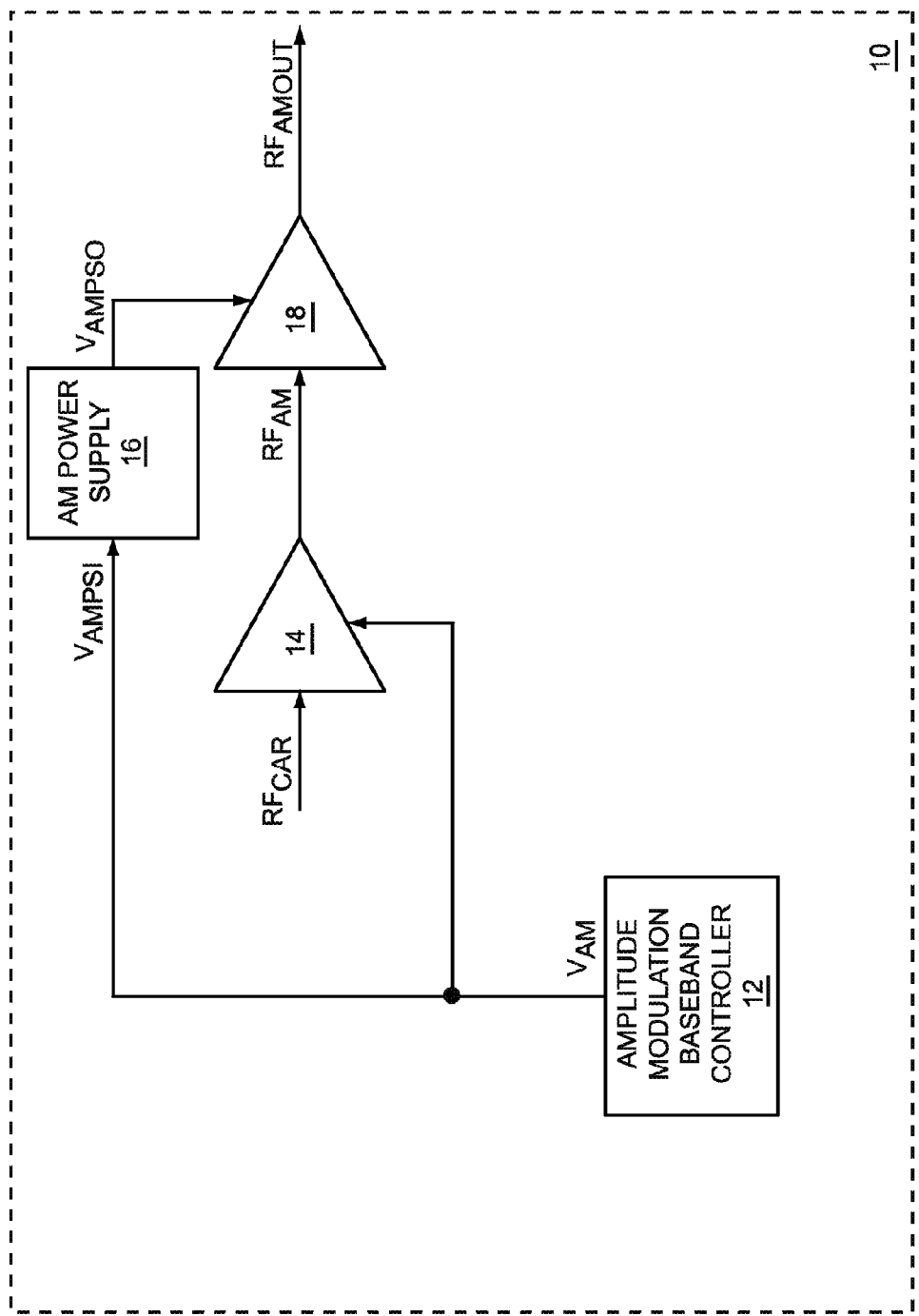
FIG. 1 shows an amplitude-modulated RF power amplifier circuit, according to the prior art.

FIG. 1 shows an amplitude-modulated RF power amplifier circuit 10, according to the prior art. AM is a modulation technique such that the amplitude of an RF carrier is modulated, which may be used to encode some kind of information. An AM baseband controller 12 provides an AM signal $V_{AM}$ to an AM modulation circuit 14. The AM signal $V_{AM}$ may provide an AM power supply input signal $V_{AMPSI}$ to an AM power supply 16, which provides an AM power supply output signal $V_{AMPSO}$ based on the AM power supply input signal $V_{AMPSI}$. The AM modulation circuit 14 receives and amplitude-modulates an RF carrier signal $RF_{CAR}$ using the AM signal $V_{AM}$ to provide an AM RF input signal $RF_{AM}$ to a PA stage 18, which amplifies the AM RF input signal $RF_{AM}$ to provide an AM RF output signal $RF_{AMOUT}$. The AM power supply output signal $V_{AMPSO}$ may provide power for amplification to the PA stage 18.

Figure 2:
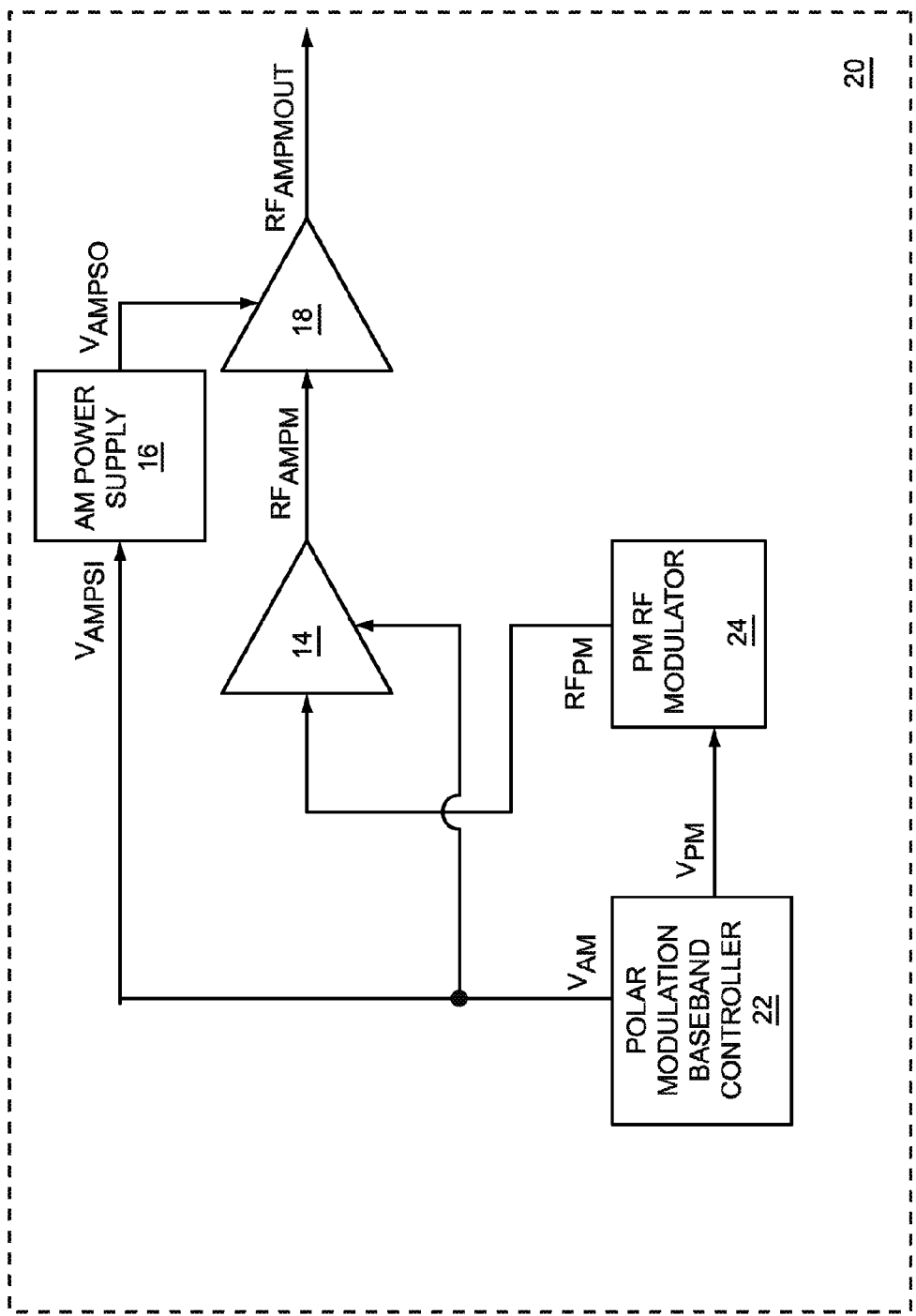
FIG. 2 shows a polar-modulated RF power amplifier circuit, according to the prior art.

FIG. 2 shows a polar-modulated RF power amplifier circuit 20, according to the prior art. Phase modulation (PM) is a modulation technique such that the phase of an RF carrier is modulated, which may be used to encode some kind of information. PM may be combined with AM to provide polar modulation, which may provide encoding of more information than either PM or AM alone. A polar modulation baseband controller 22 provides the AM signal $V_{AM}$ to the AM modulation circuit 14 and a PM signal $V_{PM}$ to a PM RF modulator 24, which phase-modulates an RF carrier signal (not shown) using the PM signal $V_{PM}$ to provide a PM RF signal $RF_{PM}$ to the AM modulation circuit 14. The AM signal $V_{AM}$ may provide the AM power supply input signal $V_{AMPSI}$ to the AM power supply 16, which provides the AM power supply output signal $V_{AMPSO}$ based on the AM power supply input signal $V_{AMPSI}$. The AM modulation circuit 14 receives and amplitude-modulates the PM RF signal $RF_{PM}$ using the AM signal $V_{AM}$ to provide a polar-modulated RF input signal $RF_{AMPM}$ to the PA stage 18, which amplifies the polar-modulated RF input signal $RF_{AMPM}$ to provide a polar-modulated RF output signal $RF_{AMPMOUT}$. The AM power supply output signal $V_{AMPSO}$ may provide power for amplification to the PA stage 18.

Figure 3:
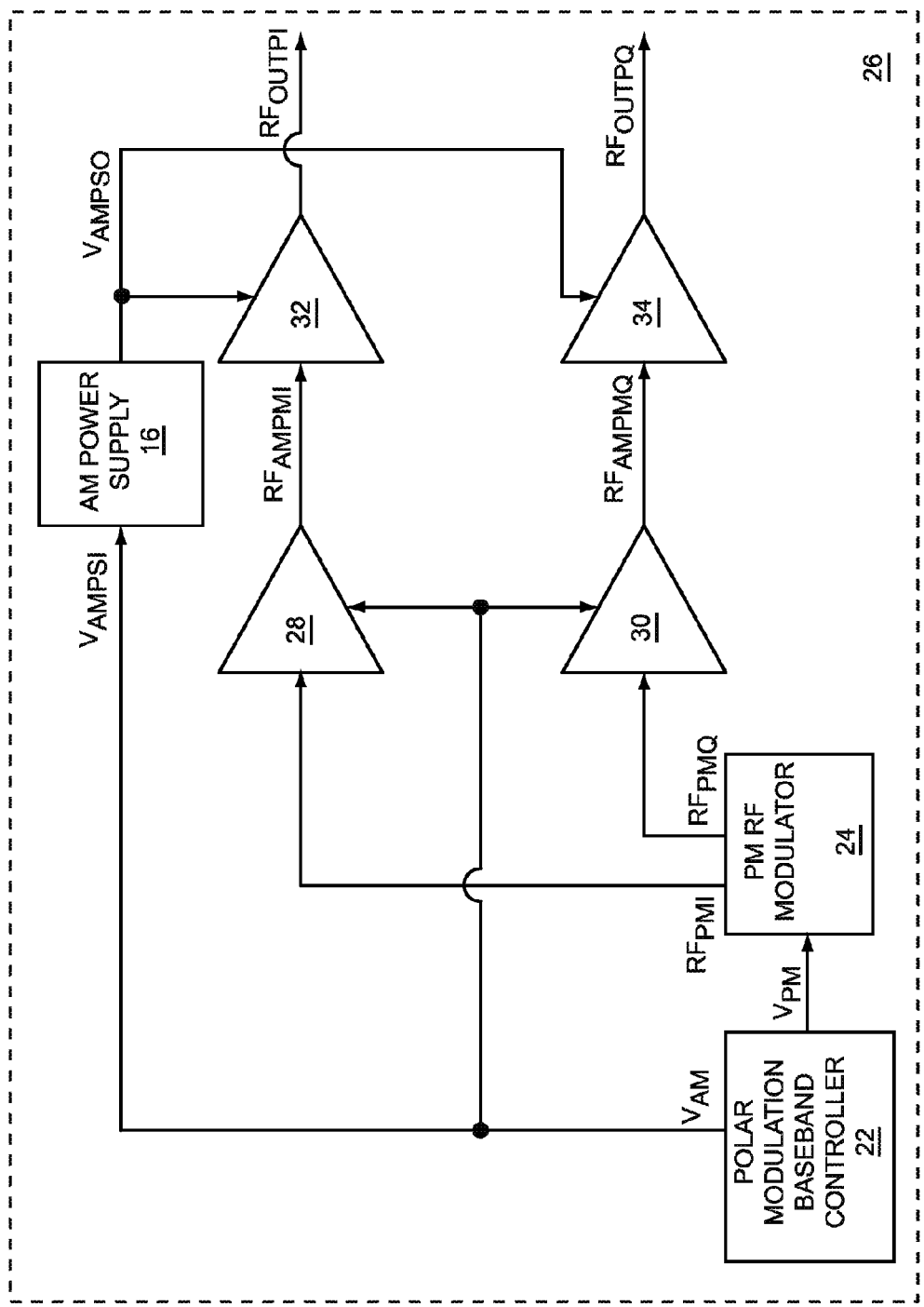
FIG. 3 shows a polar-modulated quadrature RF power amplifier circuit, according to the prior art.

FIG. 3 shows a polar-modulated quadrature RF power amplifier circuit 26, according to the prior art. The polar modulation baseband controller 22 provides the AM signal $V_{AM}$ to an in-phase AM modulation circuit 28 and a quadrature-phase AM modulation circuit 30, and the PM signal $V_{PM}$ to the PM RF modulator 24, which phase-modulates an RF carrier signal (not shown) using the PM signal $V_{PM}$ to provide an in-phase PM RF signal $RF_{PMI}$ to the in-phase AM modulation circuit 28 and a quadrature-phase PM RF signal $RF_{PMQ}$ to the quadrature-phase AM modulation circuit 30. The AM signal $V_{AM}$ may provide the AM power supply input signal $V_{AMPSI}$ to the AM power supply 16, which provides the AM power supply output signal $V_{AMPSO}$ based on the AM power supply input signal $V_{AMPSI}$.

The in-phase AM modulation circuit 28 receives and amplitude-modulates the in-phase PM RF signal $RF_{PMI}$ using the AM signal $V_{AM}$ to provide an in-phase polar-modulated RF input signal $RF_{AMPMI}$ to an in-phase PA stage 32, which amplifies the in-phase polar-modulated RF input signal $RF_{AMPMI}$ to provide an in-phase polar-modulated RF output signal $RF_{OUTPI}$. The quadrature-phase AM modulation circuit 30 receives and amplitude-modulates the quadrature-phase PM RF signal $RF_{PMQ}$ using the AM signal $V_{AM}$ to provide a quadrature-phase polar-modulated RF input signal $RF_{AMPMQ}$ to a quadrature-phase PA stage 34, which amplifies the quadrature-phase polar-modulated RF input signal $RF_{AMPMQ}$ to provide a quadrature-phase polar-modulated RF output signal $RF_{OUTPQ}$. The AM power supply output signal $V_{AMPSO}$ may provide power for amplification to the in-phase PA stage 32 and the quadrature-phase PA stage 34. The in-phase PM RF signal $RF_{PMI}$ may be of about equal amplitude to and phase-shifted from the quadrature-phase PM RF signal $RF_{PMQ}$ by about 90 degrees.

Figure 4:
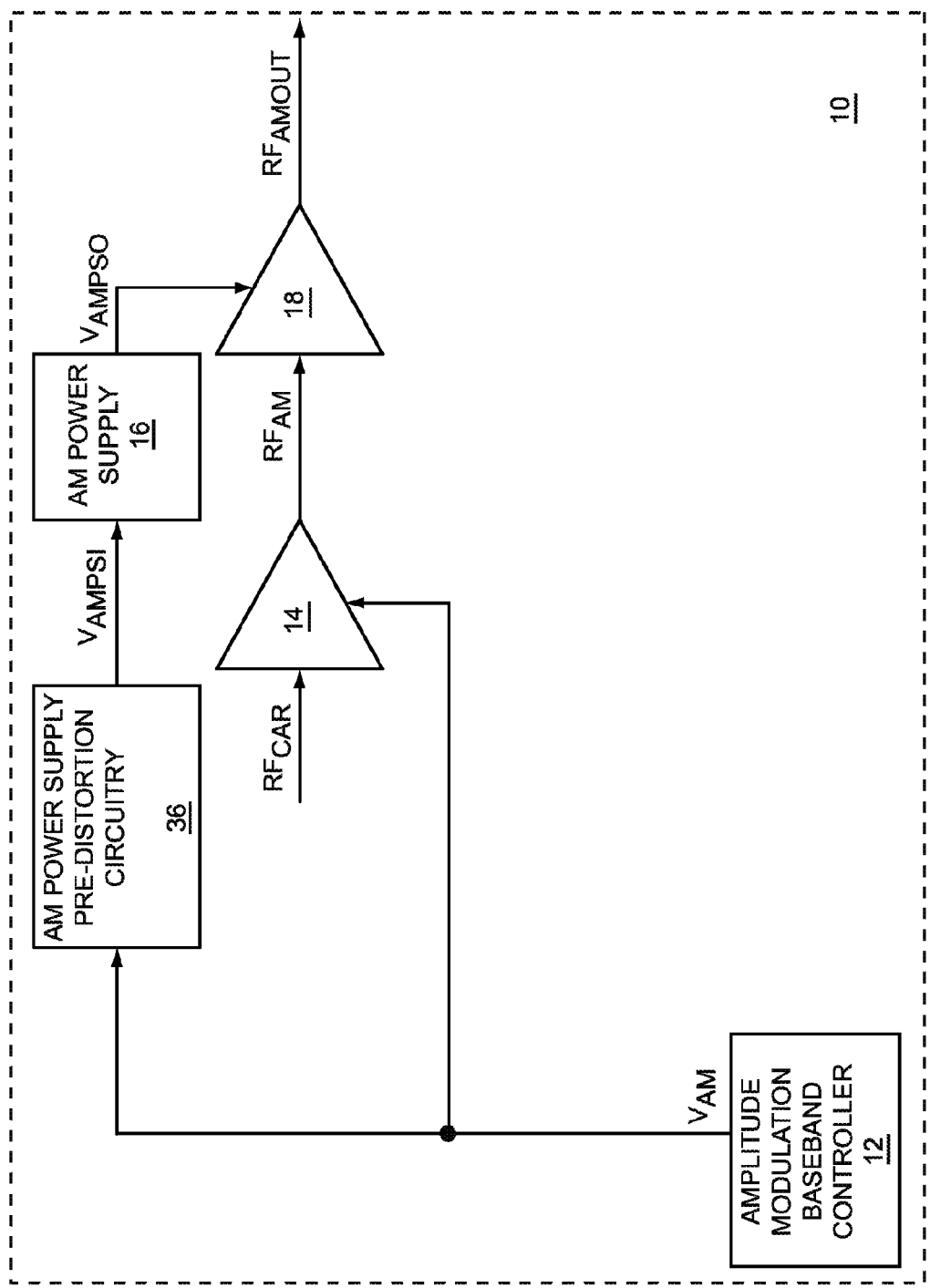
FIG. 4 shows amplitude modulation (AM) power supply pre-distortion circuitry added to the amplitude-modulated RF power amplifier circuit illustrated in FIG. 1, according to one embodiment of the present invention.

FIG. 4 shows AM power supply pre-distortion circuitry 36 added to the amplitude-modulated RF power amplifier circuit 10 illustrated in FIG. 1, according to one embodiment of the present invention. The AM power supply pre-distortion circuitry 36 receives and pre-distorts the AM signal $V_{AM}$ to provide the AM power supply input signal $V_{AMPSI}$, which pre-distorts the AM power supply output signal $V_{AMPSO}$. The pre-distortion of the AM signal $V_{AM}$ may be used to improve the linearity, the efficiency, or both, of the PA stage 18. The AM RF input signal $RF_{AM}$, the AM RF output signal $RF_{AMOUT}$, or both, may be single-ended signals. The pre-distortion of the AM signal $V_{AM}$ to provide the AM power supply input signal $V_{AMPSI}$ may include reducing the bandwidth of the AM power supply input signal $V_{AMPSI}$. In one embodiment of the present invention, the bandwidth of the AM signal $V_{AM}$ is greater than the bandwidth of the AM power supply input signal $V_{AMPSI}$. In a first exemplary embodiment of the present invention, the bandwidth of the AM signal $V_{AM}$ is at least two times the bandwidth of the AM power supply input signal $V_{AMPSI}$. In a second exemplary embodiment of the present invention, the bandwidth of the AM signal $V_{AM}$ is at least about twelve megahertz and the bandwidth of the AM power supply input signal $V_{AMPSI}$ is about six megahertz. Reducing the bandwidth of the AM power supply input signal $V_{AMPSI}$ may allow increases in efficiency while reducing difficulties in meeting linearity constraints. The AM power supply input signal $V_{AMPSI}$ may be based on values extracted from a look-up table, interpolation between values in the look-up table, or both. The look-up table may be divided into several sub look-up tables such that a sub look-up table is selected based on a target output power of the PA stage 18. A digital ramp may be used to switch from one sub look-up table to another sub look-up table while minimizing or eliminating any transients on the AM power supply input signal $V_{AMPSI}$.

Figure 5:
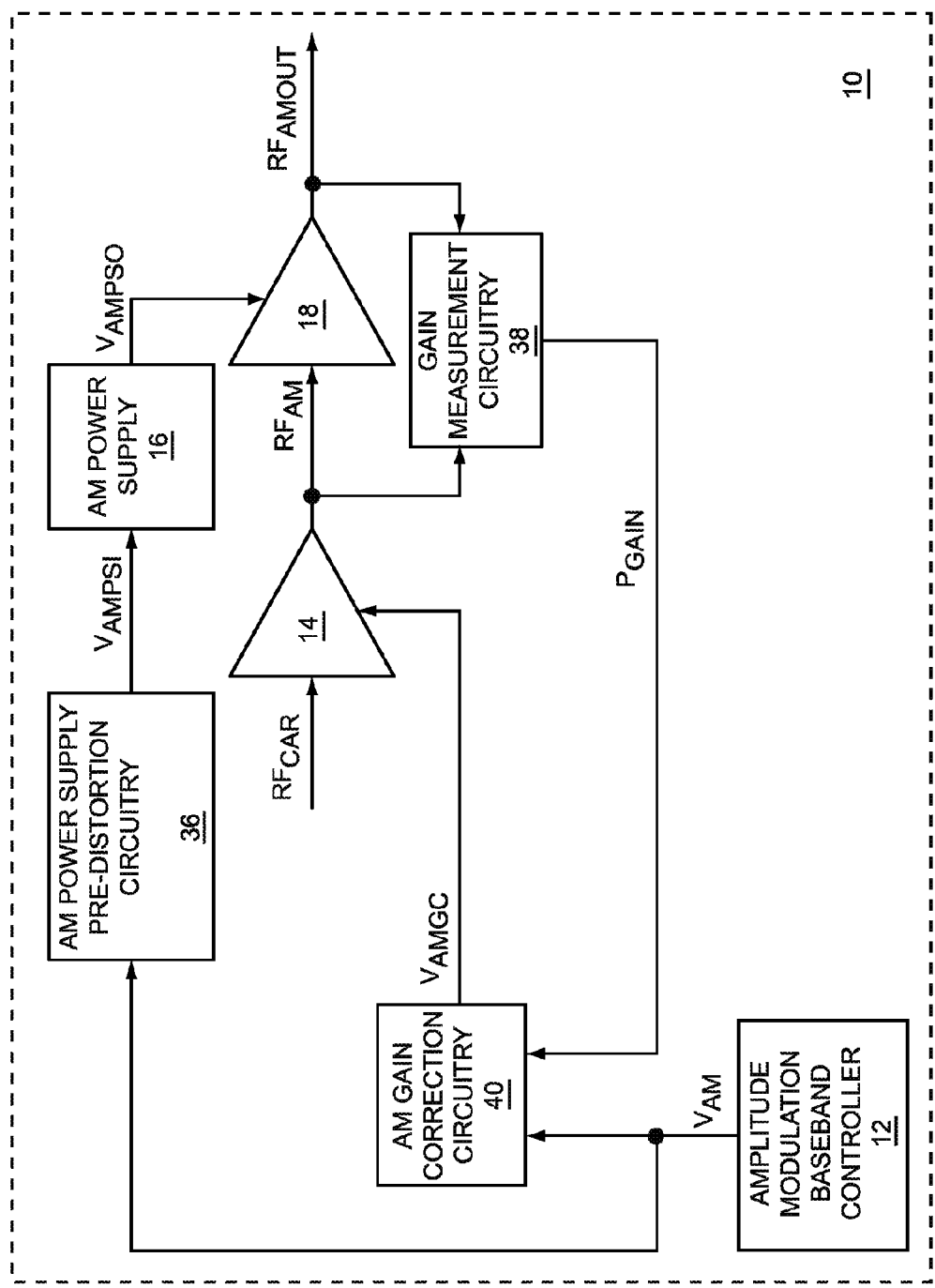
FIG. 5 shows gain measurement circuitry and AM gain correction circuitry added to the amplitude-modulated RF power amplifier circuit illustrated in FIG. 4.

FIG. 5 shows gain measurement circuitry 38 and AM gain correction circuitry 40 added to the amplitude-modulated RF power amplifier circuit 10 illustrated in FIG. 4. The gain measurement circuitry 38 may enable continuous or periodic measurements of gain of the PA stage 18 based on the AM RF input signal $RF_{AM}$ and the AM RF output signal $RF_{AMOUT}$ as is disclosed in commonly owned and assigned U.S. patent application Ser. No. 11/113,873, filed Apr. 25, 2005, entitled "POWER CONTROL SYSTEM FOR A CONTINUOUS TIME MOBILE TRANSMITTER," which has been incorporated herein by reference in its entirety. In one embodiment of the present invention, measurement of the gain of the PA stage 18 may occur inside a slot boundary transition defined by a wireless communications protocol. The gain measurement may be taken in less than 25 micro-seconds. The gain measurement circuitry 38 provides a gain signal $P_{GAIN}$ based on the gain measurement to the AM gain correction circuitry 40, which receives and gain-corrects the AM signal $V_{AM}$ based on the gain signal $P_{GAIN}$ to provide a gain-corrected AM signal $V_{AMGC}$ to the AM modulation circuit 14. The AM modulation circuit 14 receives and amplitude-modulates the RF carrier signal $RF_{CAR}$ using the gain-corrected AM signal $V_{AMGC}$ to provide the AM RF input signal $RF_{AM}$. By gain-correcting the AM signal $V_{AM}$ based on the gain signal $P_{GAIN}$, the AM gain correction circuitry 40 may regulate the gain of the PA stage 18.

Figure 6:
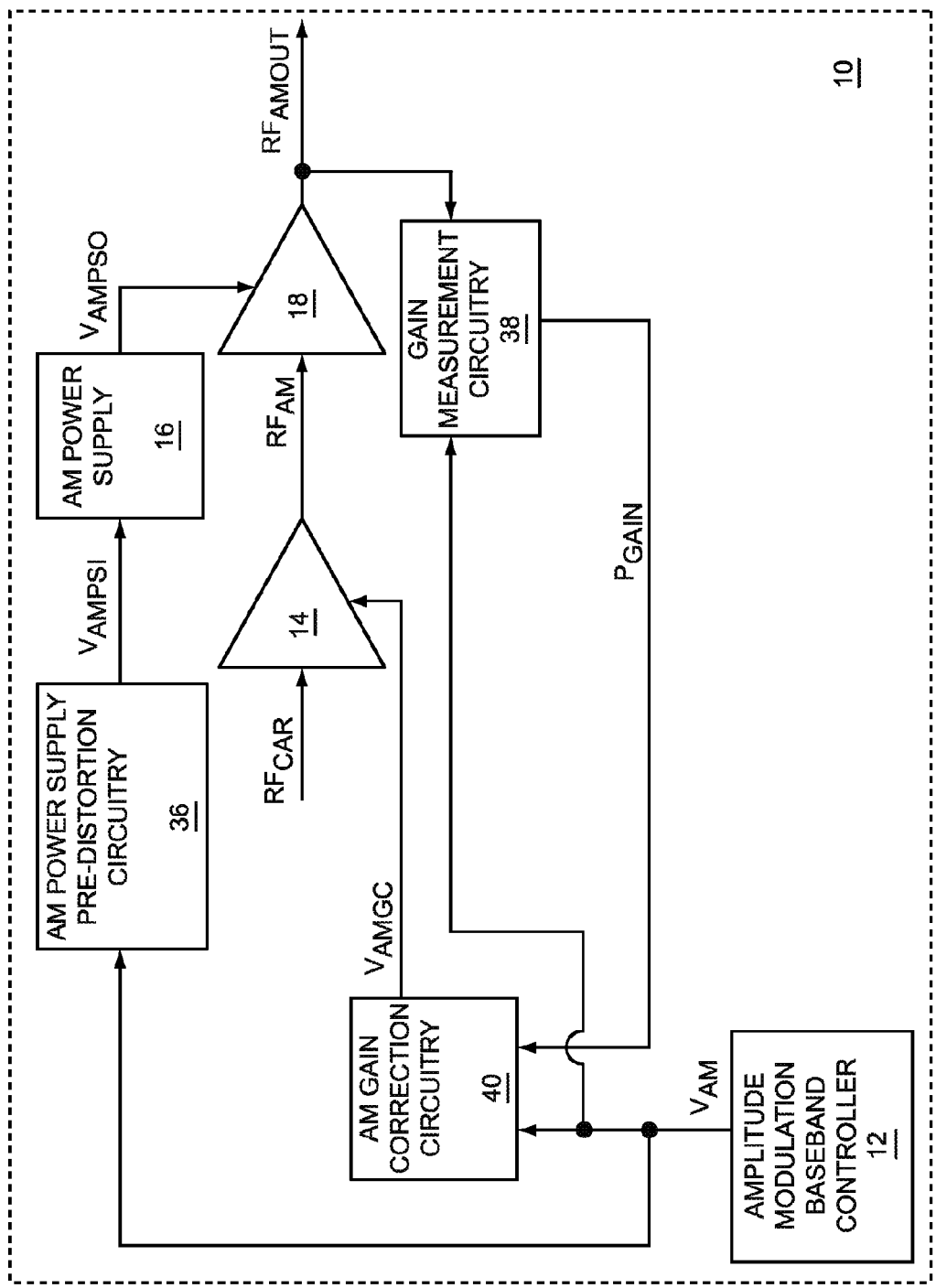
FIG. 6 shows the gain measurement circuitry and the AM gain correction circuitry added to the amplitude-modulated RF power amplifier circuit illustrated in FIG. 4, according to an alternate embodiment of the amplitude-modulated RF power amplifier circuit.

FIG. 6 shows the gain measurement circuitry 38 and the AM gain correction circuitry 40 added to the amplitude-modulated RF power amplifier circuit 10 illustrated in FIG. 4, according to an alternate embodiment of the amplitude-modulated RF power amplifier circuit 10. The gain measurement circuitry 38 may enable continuous or periodic measurements of gain of the PA stage 18 based on the AM signal $V_{AM}$ and the AM RF output signal $RF_{AMOUT}$ as is disclosed in commonly owned and assigned U.S. patent application Ser. No. 11/113,873, filed Apr. 25, 2005, entitled "POWER CONTROL SYSTEM FOR A CONTINUOUS TIME MOBILE TRANSMITTER," which has been incorporated herein by reference in its entirety. In one embodiment of the present invention, measurement of the gain of the PA stage 18 may occur inside a slot boundary transition defined by a wireless communications protocol. The gain measurement may be taken in less than 25 micro-seconds. The gain measurement circuitry 38 provides a gain signal $P_{GAIN}$ based on the gain measurement to the AM gain correction circuitry 40, which receives and gain-corrects the AM signal $V_{AM}$ based on the gain signal $P_{GAIN}$ to provide a gain-corrected AM signal $V_{AMGC}$ to the AM modulation circuit 14. The AM modulation circuit 14 receives and amplitude-modulates the RF carrier signal $RF_{CAR}$ using the gain-corrected AM signal $V_{AMGC}$ to provide the AM RF input signal $RF_{AM}$. By gain-correcting the AM signal $V_{AM}$ based on the gain signal $P_{GAIN}$, the AM gain correction circuitry 40 may regulate the gain of the PA stage 18.

Figure 7:
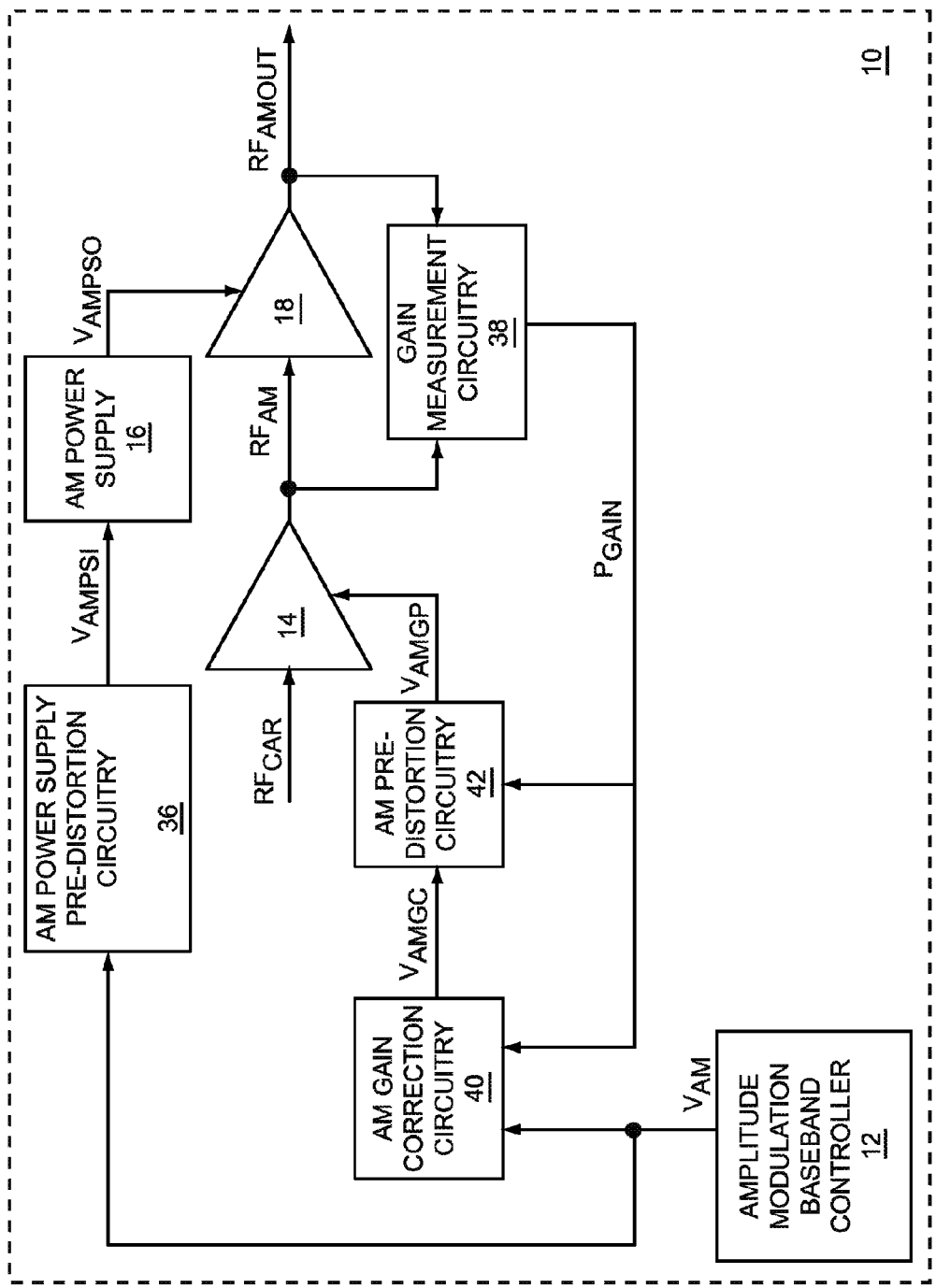
FIG. 7 shows AM pre-distortion circuitry added to the amplitude-modulated RF power amplifier circuit illustrated in FIG. 5.

FIG. 7 shows AM pre-distortion circuitry 42 added to the amplitude-modulated RF power amplifier circuit 10 illustrated in FIG. 5. The AM pre-distortion circuitry 42 receives and pre-distorts the gain-corrected AM signal $V_{AMGC}$ to provide a pre-distorted gain-corrected AM signal $V_{AMGP}$ to the AM modulation circuit 14. The AM modulation circuit 14 receives and amplitude-modulates the RF carrier signal $RF_{CAR}$ using the pre-distorted gain-corrected AM signal $V_{AMGP}$ to provide the AM RF input signal $RF_{AM}$. The pre-distortion of the gain-corrected AM signal $V_{AMGC}$ to provide the pre-distorted gain-corrected AM signal $V_{AMGP}$ may be used to prevent the AM RF input signal $RF_{AM}$ from driving the PA stage 18 into saturation in the presence of large signal swings due to gain corrections. In one embodiment of the present invention, the pre-distorted gain-corrected AM signal $V_{AMGP}$ may provide soft-clipping of the AM RF input signal $RF_{AM}$, which may prevent the AM RF input signal $RF_{AM}$ from driving the PA stage 18 into saturation. The pre-distorted gain-corrected AM signal $V_{AMGP}$ may be based on the gain-corrected AM signal $V_{AMGC}$ and the gain signal $P_{GAIN}$. The pre-distorted gain-corrected AM signal $V_{AMGP}$ may be based on values extracted from a look-up table, interpolation between values in the look-up table, or both.

Figure 8:
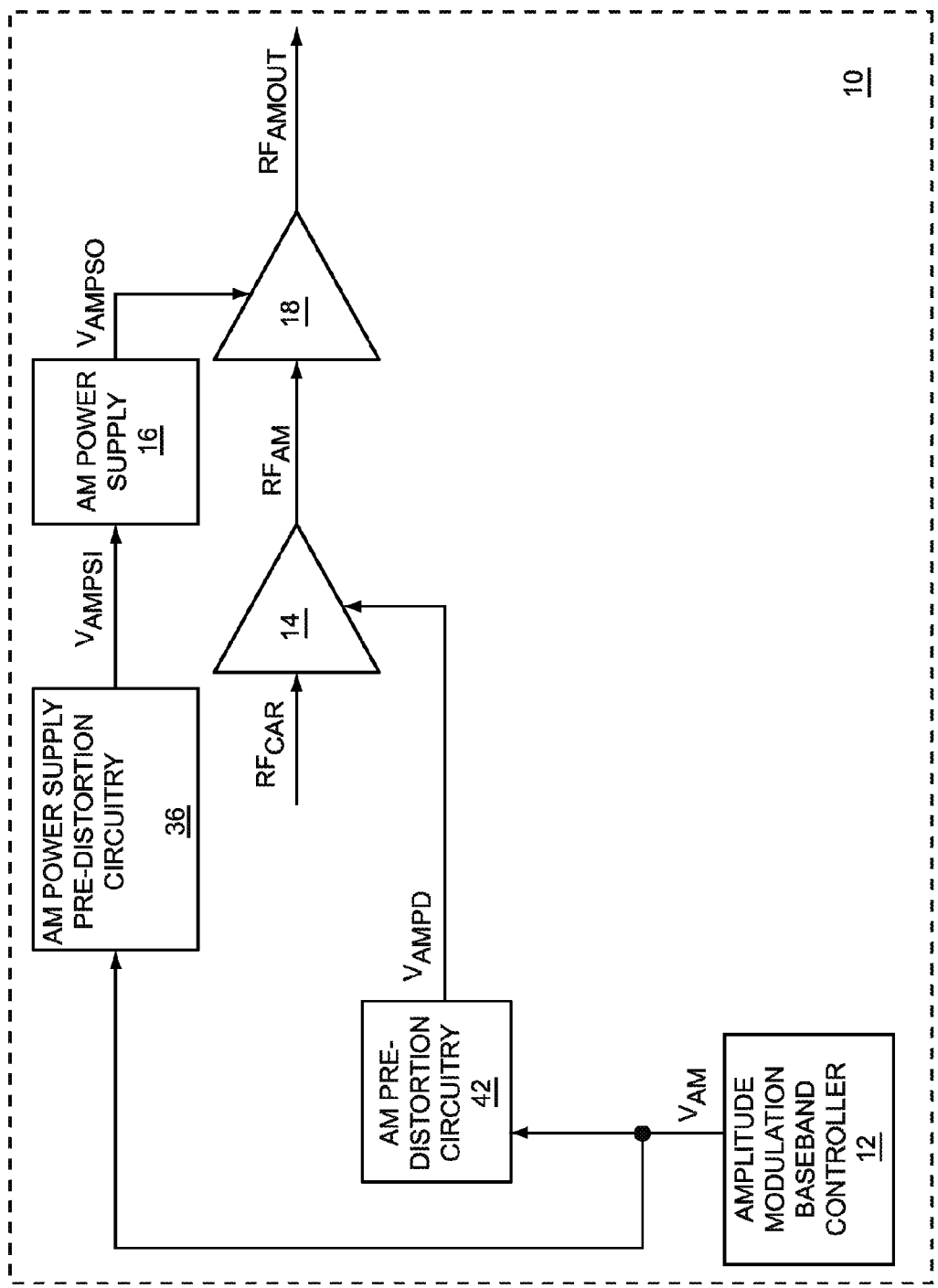
FIG. 8 shows the AM pre-distortion circuitry added to the amplitude-modulated RF power amplifier circuit illustrated in FIG. 4.

FIG. 8 shows the AM pre-distortion circuitry 42 added to the amplitude-modulated RF power amplifier circuit 10 illustrated in FIG. 4. The AM pre-distortion circuitry 42 receives and pre-distorts the AM signal $V_{AM}$ to provide a pre-distorted AM signal $V_{AMPD}$ to the AM modulation circuit 14. The AM modulation circuit 14 receives and amplitude-modulates the RF carrier signal $RF_{CAR}$ using the pre-distorted AM signal $V_{AMPD}$ to provide the AM RF input signal $RF_{AM}$. The pre-distortion of the AM signal $V_{AM}$ to provide the pre-distorted AM signal $V_{AMPD}$ may be used to augment the pre-distortion of the AM signal $V_{AM}$ to provide the AM power supply input signal $V_{AMPSI}$ that is provided by the AM power supply pre-distortion circuitry 36. The pre-distorted AM signal $V_{AMPD}$ may be based on values extracted from a look-up table, interpolation between values in the look-up table, or both.

Figure 9:
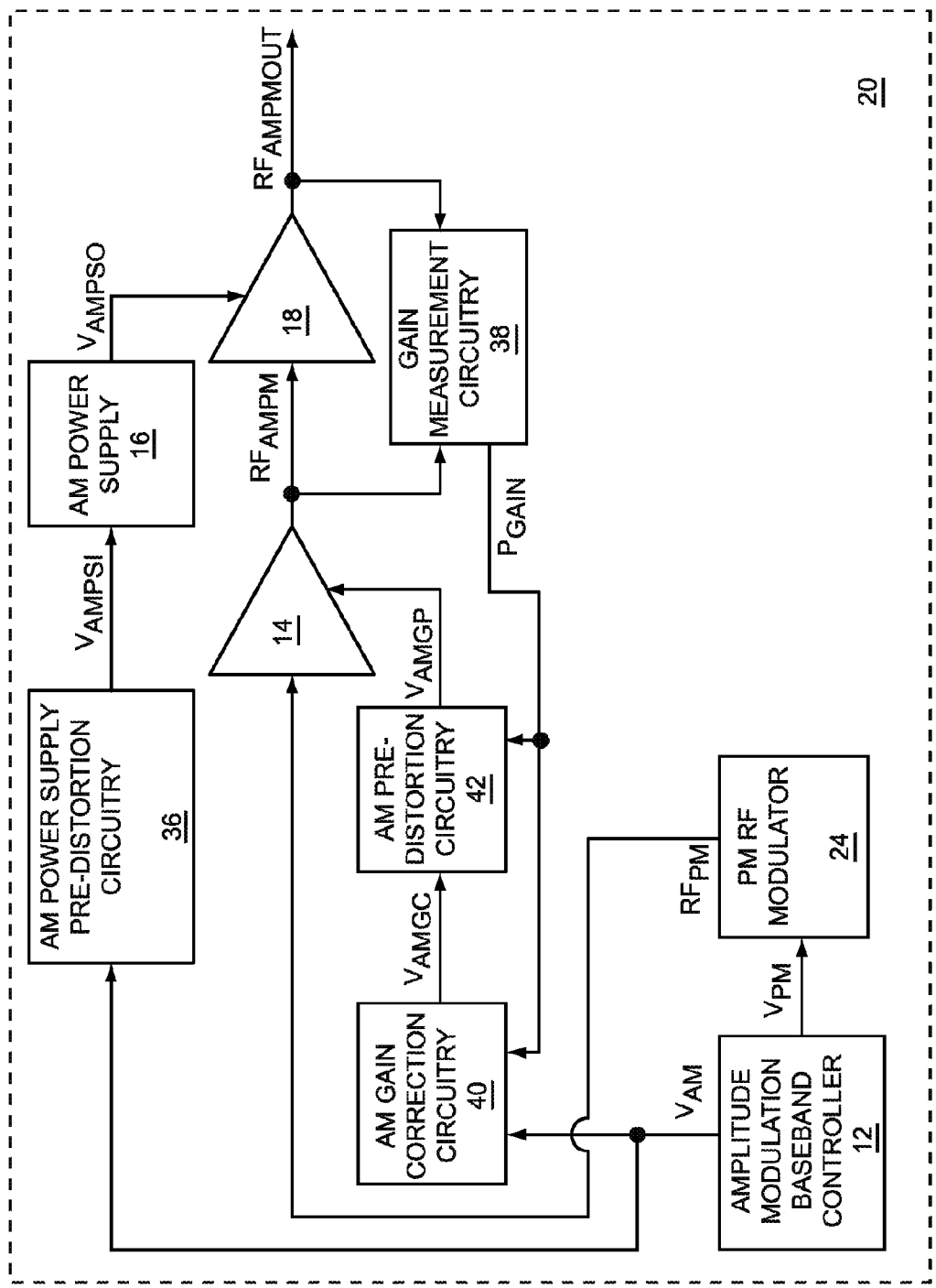
FIG. 9 shows the AM power supply pre-distortion circuitry, the gain measurement circuitry, the AM gain correction circuitry, and the AM pre-distortion circuitry added to the polar-modulated RF power amplifier circuit illustrated in FIG. 2, according to an alternate embodiment of the present invention.

FIG. 9 shows the AM power supply pre-distortion circuitry 36, the gain measurement circuitry 38, the AM gain correction circuitry 40, and the AM pre-distortion circuitry 42 added to the polar-modulated RF power amplifier circuit 20 illustrated in FIG. 2, according to an alternate embodiment of the present invention. The polar-modulated RF power amplifier circuit 20 illustrated in FIG. 9 is similar to the amplitude-modulated RF power amplifier circuit 10 illustrated in FIG. 7. The AM baseband controller 12 is replaced with the polar modulation baseband controller 22 and the PM RF modulator 24. The AM modulation circuit 14 receives the PM RF signal $RF_{PM}$ from the PM RF modulator 24 instead of the RF carrier signal $RF_{CAR}$. The AM modulation circuit 14 amplitude-modulates the PM RF signal $RF_{PM}$ using the pre-distorted gain-corrected AM signal $V_{AMGP}$ to provide the polar-modulated RF input signal $RF_{AMPM}$ instead of the AM RF input signal $RF_{AM}$. The PA stage 18 receives and amplifies the polar-modulated RF input signal $RF_{AMPM}$ to provide the polar-modulated RF output signal $RF_{AMPMOUT}$ instead of receiving and amplifying the AM RF input signal $RF_{AM}$ to provide the AM RF output signal $RF_{AMOUT}$. The gain measurement circuitry 38 measures gain of the PA stage 18 based on the polar-modulated RF input signal $RF_{AMPM}$ and the polar-modulated RF output signal $RF_{AMPMOUT}$ instead of the AM RF input signal $RF_{AM}$ and the AM RF output signal $RF_{AMOUT}$. In another embodiment of the present invention, any or all of the gain measurement circuitry 38, the AM gain correction circuitry 40, and the AM pre-distortion circuitry 42 may be omitted.

Figure 10:
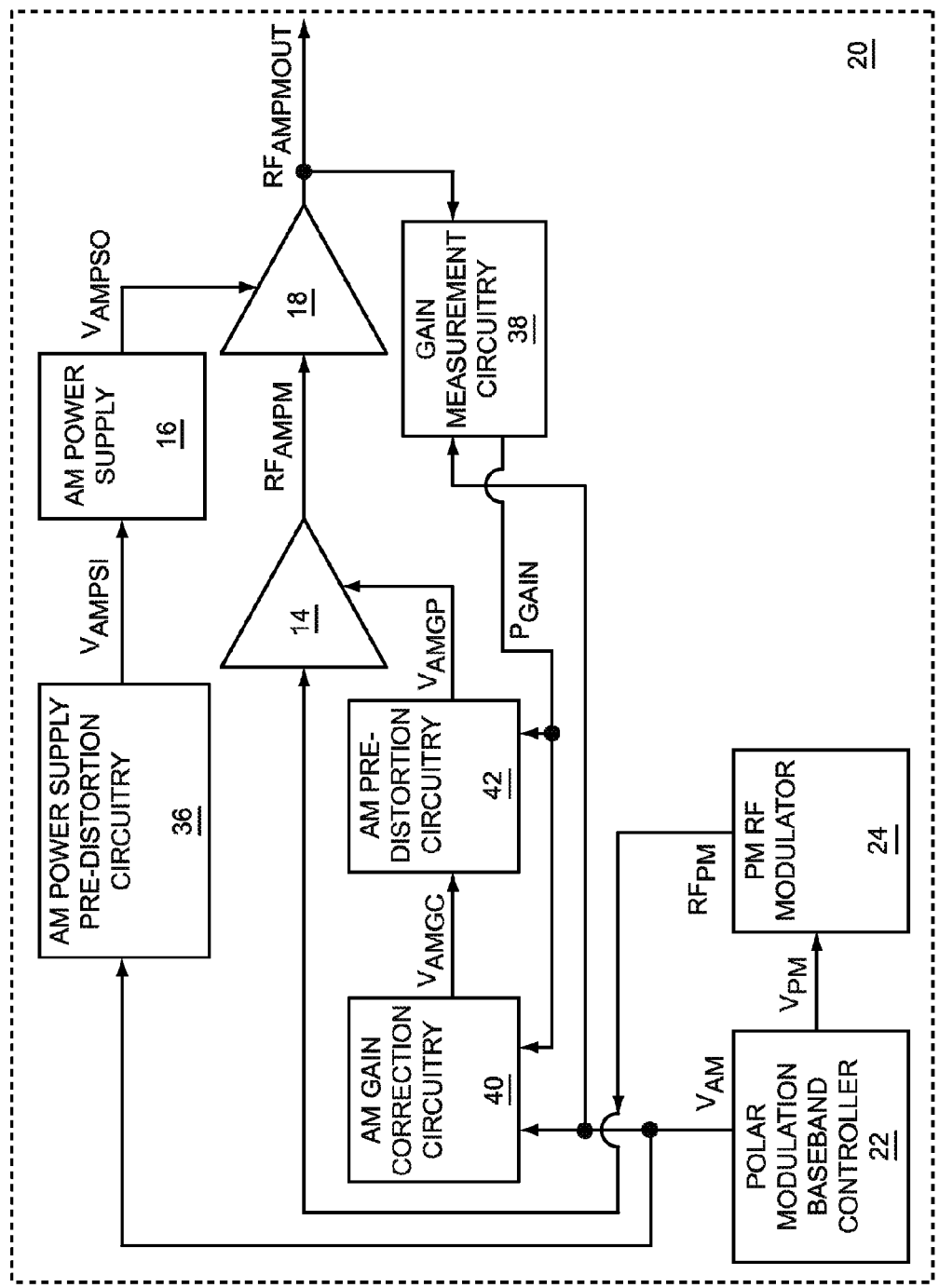
FIG. 10 shows an alternate embodiment of the polar-modulated RF power amplifier circuit.

FIG. 10 shows an alternate embodiment of the polar-modulated RF power amplifier circuit 20, which is similar to the polar-modulated RF power amplifier circuit 20 illustrated in FIG. 9. The gain measurement circuitry 38 measures gain of the PA stage 18 based on the AM signal $V_{AM}$ and the polar-modulated RF output signal $RF_{AMPMOUT}$ instead of the polar-modulated RF input signal $RF_{AMPM}$ and the polar-modulated RF output signal $RF_{AMPMOUT}$. In another embodiment of the present invention, any or all of the gain measurement circuitry 38, the AM gain correction circuitry 40, and the AM pre-distortion circuitry 42 may be omitted.

Figure 11:
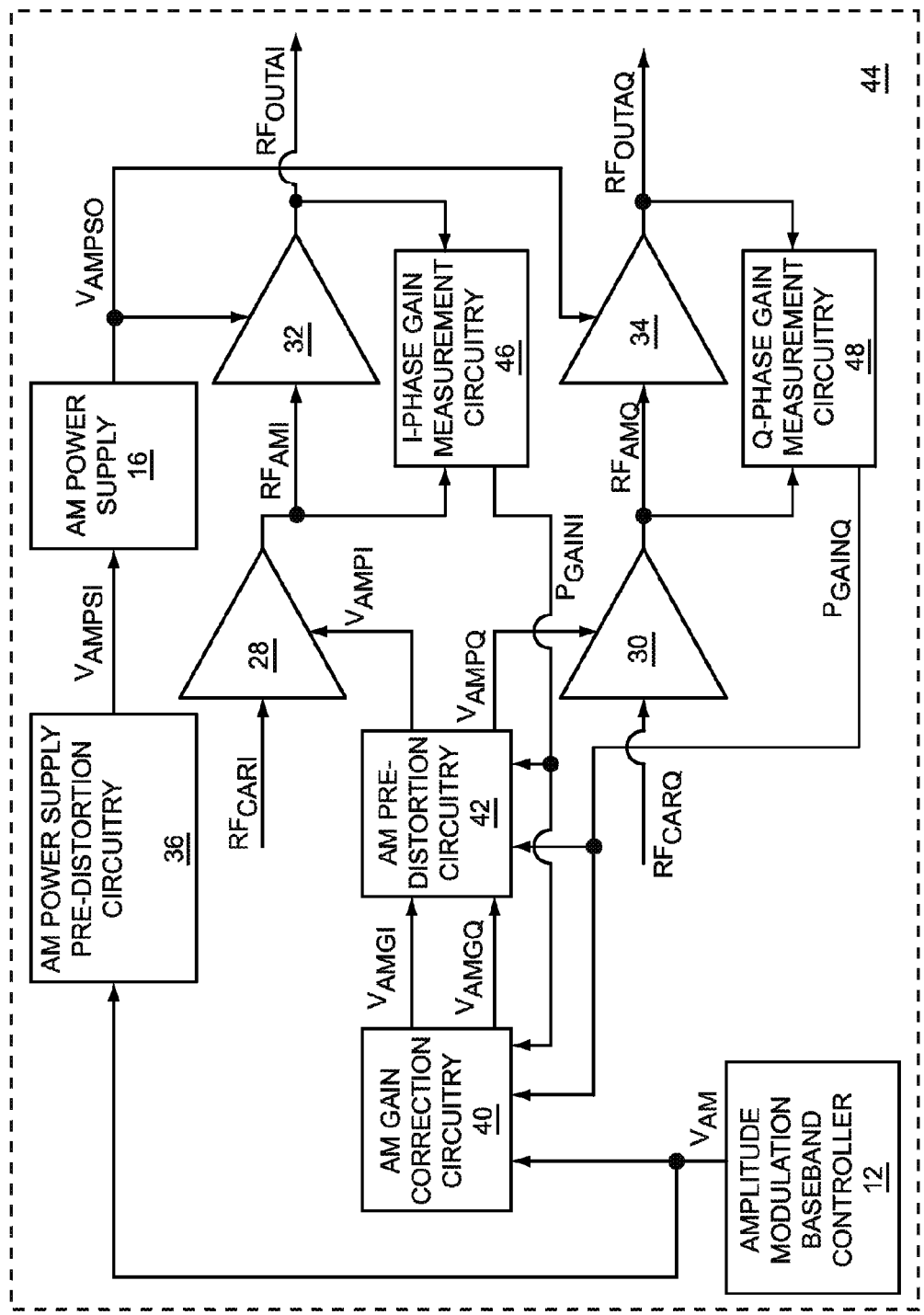
FIG. 11 shows an amplitude-modulated quadrature RF power amplifier circuit, according to an additional embodiment of the present invention.

FIG. 11 shows an amplitude-modulated quadrature RF power amplifier circuit 44, according to an additional embodiment of the present invention. The AM baseband controller 12 provides the AM signal $V_{AM}$ to the AM power supply pre-distortion circuitry 36 and the AM gain correction circuitry 40, which gain-corrects the AM signal $V_{AM}$ based on an in-phase gain signal $P_{GAINI}$ to provide an in-phase gain-corrected AM signal $V_{AMGI}$ to the AM pre-distortion circuitry 42 and based on a quadrature-phase gain signal $P_{GAINQ}$ to provide a quadrature-phase gain-corrected AM signal $V_{AMGQ}$ to the AM pre-distortion circuitry 42. The AM pre-distortion circuitry 42 receives and pre-distorts the in-phase gain-corrected AM signal $V_{AMGI}$ to provide an in-phase pre-distorted gain-corrected AM signal $V_{AMPI}$ to the in-phase AM modulation circuit 28. Additionally, the AM pre-distortion circuitry 42 receives and pre-distorts the quadrature-phase gain-corrected AM signal $V_{AMGQ}$ to provide a quadrature-phase pre-distorted gain-corrected AM signal $V_{AMPQ}$ to the quadrature-phase AM modulation circuit 30. The in-phase AM modulation circuit 28 receives and amplitude-modulates an in-phase RF carrier signal $RF_{CARI}$ using the in-phase pre-distorted gain-corrected AM signal $V_{AMPI}$ to provide an in-phase AM RF input signal $RF_{AMI}$. Additionally, the quadrature-phase AM modulation circuit 30 receives and amplitude-modulates a quadrature-phase RF carrier signal $RF_{CARQ}$ using the quadrature-phase pre-distorted gain-corrected AM signal $V_{AMPQ}$ to provide a quadrature-phase AM RF input signal $RF_{AMQ}$.

The in-phase PA stage 32 receives and amplifies the in-phase AM RF input signal $RF_{AMI}$ to provide an in-phase AM RF output signal $RF_{OUTAI}$. The quadrature-phase PA stage 34 receives and amplifies the quadrature-phase AM RF input signal $RF_{AMQ}$ to provide a quadrature-phase AM RF output signal $RF_{OUTAQ}$. The AM power supply output signal $V_{AMPSO}$ may provide power for amplification to the in-phase PA stage 32 and the quadrature-phase PA stage 34. The in-phase RF carrier signal $RF_{CARI}$ may be of about equal amplitude to and phase-shifted from the quadrature-phase RF carrier signal $RF_{CARQ}$ by about 90 degrees.

The AM power supply pre-distortion circuitry 36 receives and pre-distorts the AM signal $V_{AM}$ to provide the AM power supply input signal $V_{AMPSI}$ to the AM power supply 16, which provides the AM power supply output signal $V_{AMPSO}$ based on the AM power supply input signal $V_{AMPSI}$. The pre-distortion of the AM signal $V_{AM}$ may be used to improve the linearity, the efficiency, or both, of the in-phase PA stage 32, the quadrature-phase PA stage 34, or both. In-phase gain measurement circuitry 46 may enable continuous or periodic measurements of gain of the in-phase PA stage 32 based on the in-phase AM RF input signal $RF_{AMI}$ and the in-phase AM RF output signal $RF_{AMOUTAI}$ as is disclosed in commonly owned and assigned U.S. patent application Ser. No. 11/113,873, filed Apr. 25, 2005, entitled "POWER CONTROL SYSTEM FOR A CONTINUOUS TIME MOBILE TRANSMITTER," which has been incorporated herein by reference in its entirety. In one embodiment of the present invention, measurement of the gain of the in-phase PA stage 32 may occur inside a slot boundary transition defined by a wireless communications protocol. The gain measurement may be taken in less than 25 micro-seconds. The in-phase gain measurement circuitry 46 provides the in-phase gain signal $P_{GAINI}$.

Quadrature-phase gain measurement circuitry 48 may enable continuous or periodic measurements of gain of the quadrature-phase PA stage 34 based on the quadrature-phase AM RF input signal $RF_{AMQ}$ and the quadrature-phase AM RF output signal $RF_{AMOUTAQ}$ as is disclosed in commonly owned and assigned U.S. patent application Ser. No. 11/113,873, filed Apr. 25, 2005, entitled "POWER CONTROL SYSTEM FOR A CONTINUOUS TIME MOBILE TRANSMITTER," which has been incorporated herein by reference in its entirety. In one embodiment of the present invention, measurement of the gain of the quadrature-phase PA stage 34 may occur inside a slot boundary transition defined by a wireless communications protocol. The gain measurement may be taken in less than 25 micro-seconds. The quadrature-phase gain measurement circuitry 48 provides the quadrature-phase gain signal $P_{GAINQ}$.

By gain-correcting the AM signal $V_{AM}$ based on the in-phase gain signal $P_{GAINI}$ and the quadrature-phase gain signal $P_{GAINQ}$, the AM gain correction circuitry 40 may regulate the gain of the in-phase PA stage 32 and the gain of the quadrature-phase PA stage 34, respectively. The pre-distortion of the in-phase gain-corrected AM signal $V_{AMGI}$ to provide the in-phase pre-distorted gain-corrected AM signal $V_{AMPI}$ may be used to prevent the in-phase AM RF input signal $RF_{AMI}$ from driving the in-phase PA stage 32 into saturation in the presence of large signal swings due to gain corrections. In one embodiment of the present invention, the in-phase pre-distorted gain-corrected AM signal $V_{AMP}$, may provide soft-clipping of the in-phase AM RF input signal $RF_{AMI}$, which may prevent the in-phase AM RF input signal $RF_{AMI}$ from driving the in-phase PA stage 32 into saturation. The in-phase pre-distorted gain-corrected AM signal $V_{AMP}$ may be based on the in-phase gain-corrected AM signal $V_{AMGI}$ and the in-phase gain signal $P_{GAINI}$. The in-phase pre-distorted gain-corrected AM signal $V_{AMPI}$ may be based on values extracted from a look-up table, interpolation between values in the look-up table, or both.

The pre-distortion of the quadrature-phase gain-corrected AM signal $V_{AMPQ}$ to provide the quadrature-phase pre-distorted gain-corrected AM signal $V_{AMPQ}$ may be used to prevent the quadrature-phase AM RF input signal $RF_{AMQ}$ from driving the quadrature-phase PA stage 34 into saturation in the presence of large signal swings due to gain corrections. In one embodiment of the present invention, the quadrature-phase pre-distorted gain-corrected AM signal $V_{AMPQ}$ may provide soft-clipping of the quadrature-phase AM RF input signal $RF_{AMQ}$, which may prevent the quadrature-phase AM RF input signal $RF_{AMQ}$ from driving the quadrature-phase PA stage 34 into saturation. The quadrature-phase pre-distorted gain-corrected AM signal $V_{AMPQ}$ may be based on the quadrature-phase gain-corrected AM signal $V_{AMPQ}$ and the quadrature-phase gain signal $P_{GAINQ}$. The quadrature-phase pre-distorted gain-corrected AM signal $V_{AMPQ}$ may be based on values extracted from a look-up table, interpolation between values in the look-up table, or both.

Figure 12:
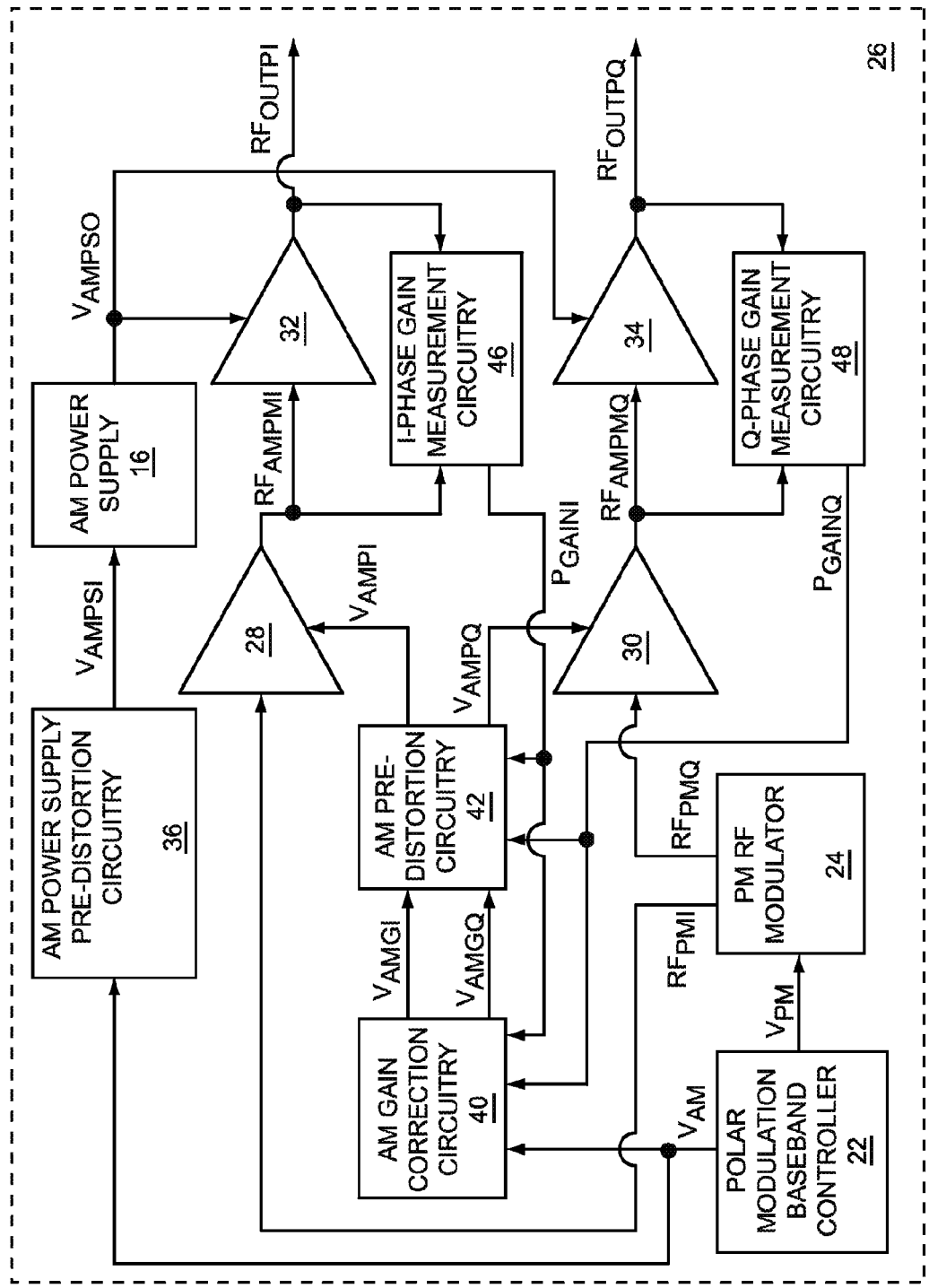
FIG. 12 shows the AM power supply pre-distortion circuitry, the gain measurement circuitry, the AM gain correction circuitry, and the AM pre-distortion circuitry added to the polar-modulated quadrature RF power amplifier circuit illustrated in FIG. 3, according to another embodiment of the present invention.

FIG. 12 shows the AM power supply pre-distortion circuitry 36, the in-phase gain measurement circuitry 46, the quadrature-phase gain measurement circuitry 48, the AM gain correction circuitry 40, and the AM pre-distortion circuitry 42 added to the polar-modulated quadrature RF power amplifier circuit 26 illustrated in FIG. 3, according to another embodiment of the present invention. The polar-modulated quadrature RF power amplifier circuit 26 illustrated in FIG. 12 is similar to the amplitude-modulated quadrature RF power amplifier circuit 44 illustrated in FIG. 11. The AM baseband controller 12 is replaced with the polar modulation baseband controller 22 and the PM RF modulator 24. The in-phase AM modulation circuit 28 receives the in-phase PM RF signal $RF_{PMI}$ from the PM RF modulator 24 instead of the in-phase RF carrier signal $RF_{CARI}$. The in-phase AM modulation circuit 28 amplitude-modulates the in-phase PM RF signal $RF_{PMI}$ using the in-phase pre-distorted gain-corrected AM signal $V_{AMPI}$ to provide the in-phase polar-modulated RF input signal $RF_{AMPMI}$ instead of providing the in-phase AM RF input signal $RF_{AMI}$. The in-phase PA stage 32 receives and amplifies the in-phase polar-modulated RF input signal $RF_{AMPMI}$ to provide the in-phase polar-modulated RF output signal $RF_{OUTPI}$ instead of receiving and amplifying the in-phase AM RF input signal $RF_{AMI}$ to provide the in-phase AM RF output signal $RF_{OUTAI}$. The in-phase gain measurement circuitry 46 measures gain of the in-phase PA stage 32 based on the in-phase polar-modulated RF input signal $RF_{AMPMI}$ and the in-phase polar modulated RF output signal $RF_{OUTPI}$ instead of the in-phase AM RF input signal $RF_{AMI}$ and the in-phase AM RF output signal $RF_{OUTAI}$.

The quadrature-phase AM modulation circuit 30 receives the quadrature-phase PM RF signal $RF_{AMQ}$ from the PM RF modulator 24 instead of the quadrature-phase RF carrier signal $RF_{CARQ}$. The quadrature-phase AM modulation circuit 30 amplitude-modulates the quadrature-phase PM RF signal $RF_{AMQ}$ using the quadrature-phase pre-distorted gain-corrected AM signal $V_{AMPQ}$ to provide the quadrature-phase polar-modulated RF input signal $RF_{AMPMQ}$ instead of providing the quadrature-phase AM RF input signal $RF_{AMQ}$. The quadrature-phase PA stage 34 receives and amplifies the quadrature-phase polar-modulated RF input signal $RF_{AMPMQ}$ to provide the quadrature-phase polar-modulated RF output signal $RF_{OUTPQ}$ instead of receiving and amplifying the quadrature-phase AM RF input signal $RF_{AMQ}$ to provide the quadrature-phase AM RF output signal $RF_{OUTAQ}$. The quadrature-phase gain measurement circuitry 48 measures gain of the quadrature-phase PA stage 34 based on the quadrature-phase polar-modulated RF input signal $RF_{AMPMQ}$ and the quadrature-phase polar-modulated RF output signal $RF_{OUTPQ}$ instead of the quadrature-phase AM RF input signal $RF_{AMQ}$ and the quadrature-phase AM RF output signal $RF_{OUTAQ}$. In another embodiment of the present invention, any or all of the in-phase gain measurement circuitry 46, the quadrature-phase gain measurement circuitry 48, the AM gain correction circuitry 40, and the AM pre-distortion circuitry 42 may be omitted.

Figure 13:
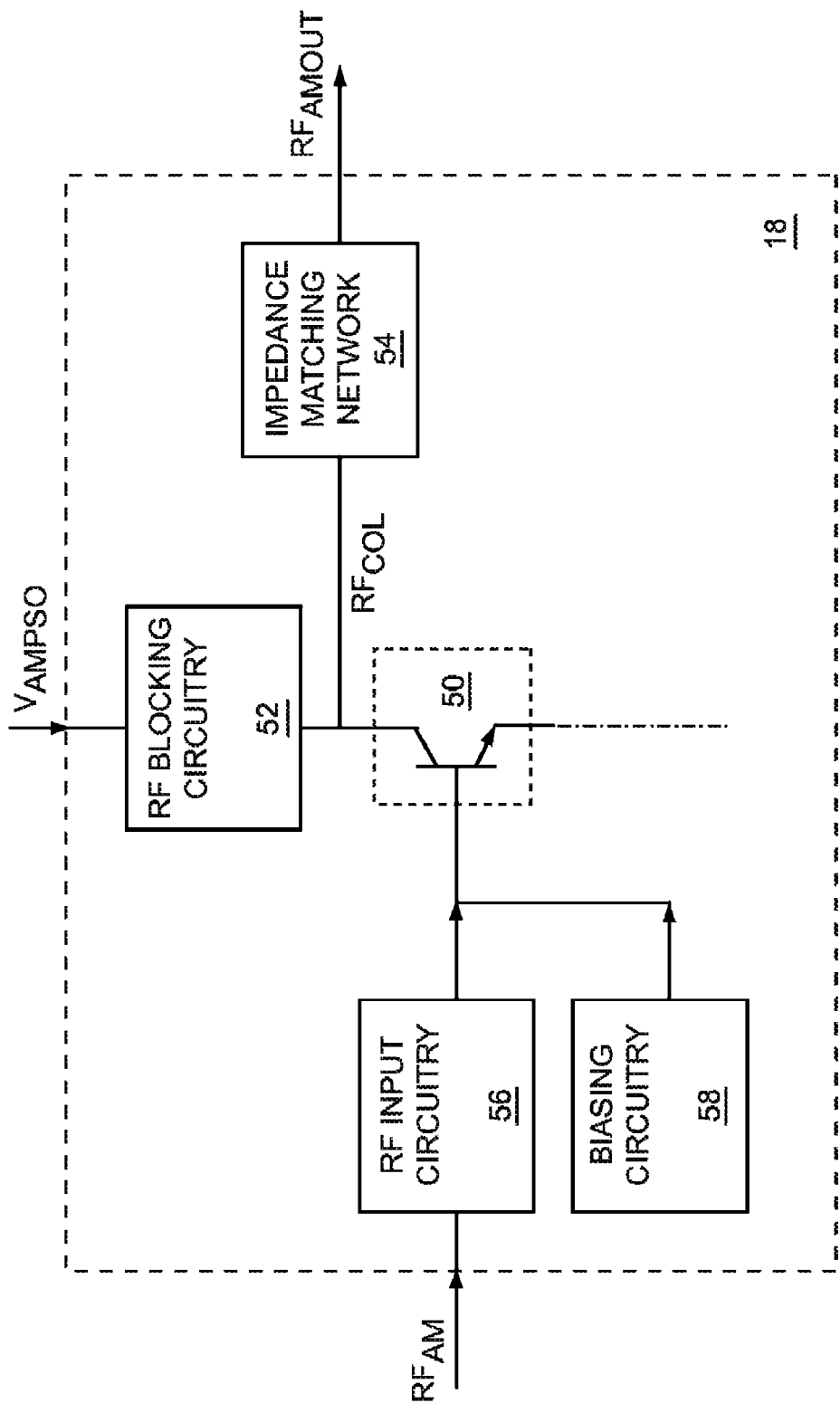
FIG. 13 shows details of a power amplifier stage illustrated in FIG. 7.
Figure 14:
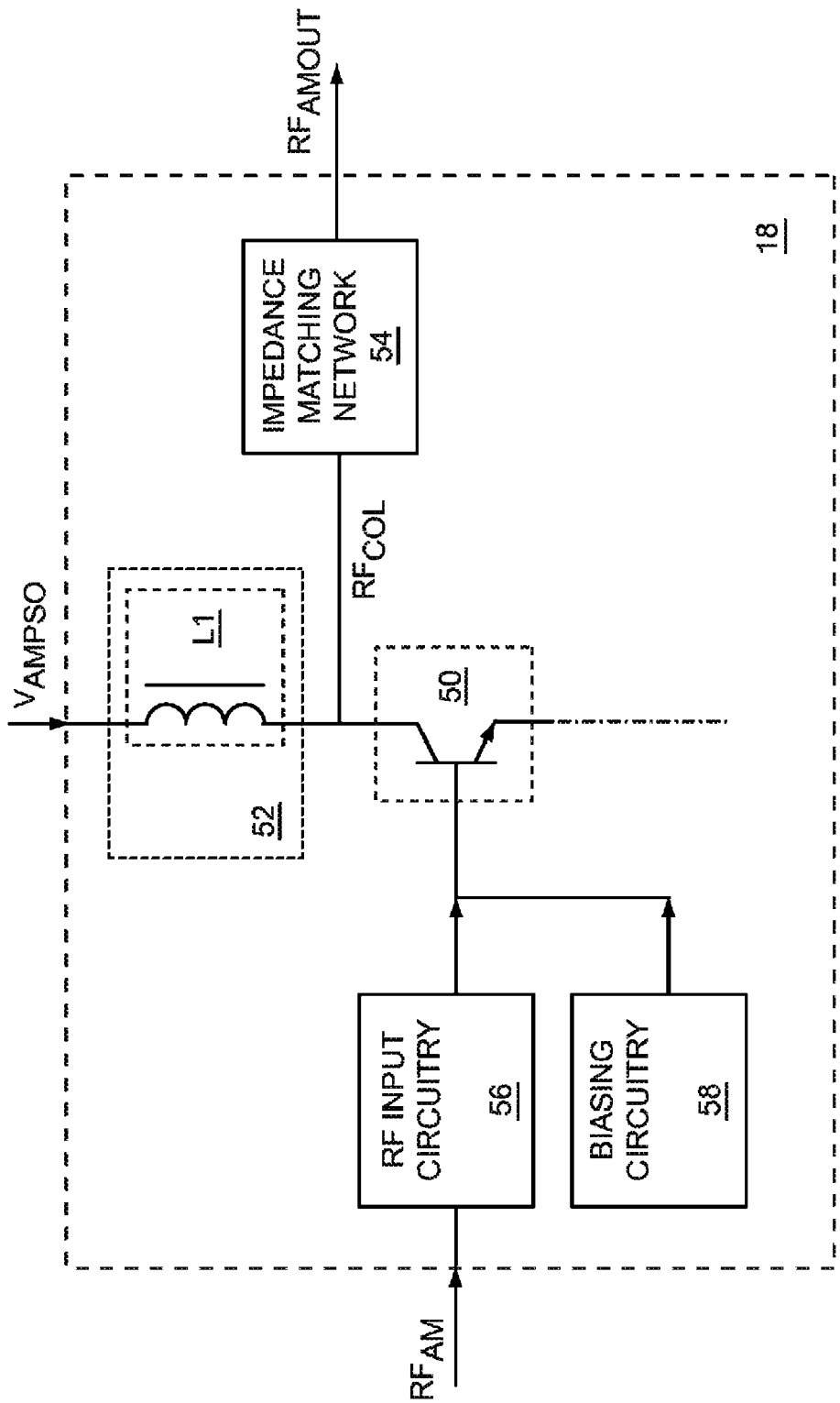
FIG. 14 shows details of RF blocking circuitry illustrated in FIG. 13.

FIG. 13 shows details of the PA stage 18 illustrated in FIG. 7. A transistor element 50 is shown as a bipolar device, and amplifies the AM RF input signal $RF_{AM}$ to provide an AM RF collector signal $RF_{COL}$ at the collector of the transistor element 50. RF blocking circuitry 52 is coupled between the collector of the transistor element 50 and the AM power supply 16 (FIG. 7) to provide the AM power supply output signal $V_{AMPSO}$ to the transistor element 50 and to block RF signals at the collector from the AM power supply 16. The collector may feed the AM RF collector signal $RF_{COL}$ through an impedance matching network 54 to provide the AM RF output signal $RF_{AMOUT}$. The impedance matching network 54 may match the impedance of downstream RF circuitry to the output impedance at the collector. The AM RF input signal $RF_{AM}$ is fed to a base of the transistor element 50 through RF input circuitry 56. Biasing circuitry 58 may provide the appropriate bias to the transistor element 50 for proper operation and may be coupled to the base of the transistor element 50. FIG. 14 shows details of the RF blocking circuitry 52 illustrated in FIG. 13. The RF blocking circuitry 52 may include a first inductive element L1.

Figure 15:
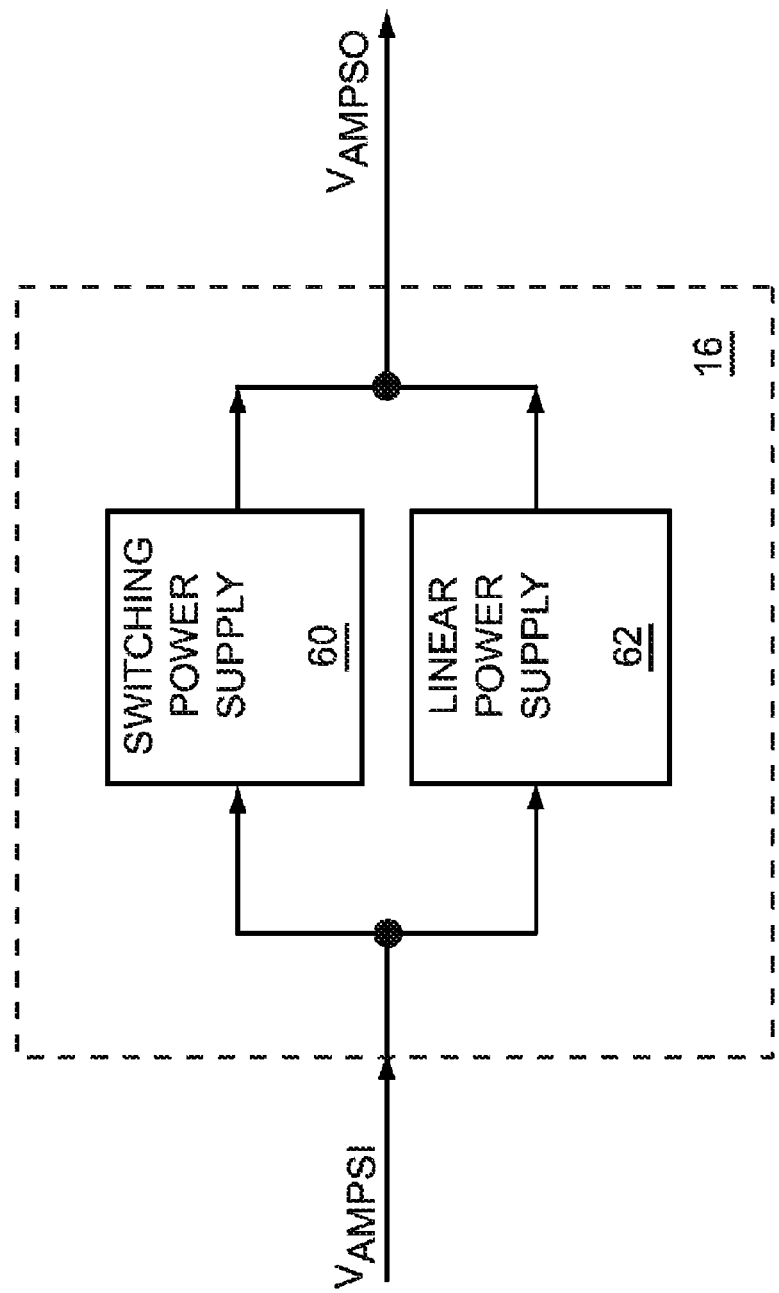
FIG. 15 shows details of the AM power supply illustrated in FIG. 4.

FIG. 15 shows details of the AM power supply 16 illustrated in FIG. 4. To meet bandwidth requirements and to maximize efficiency, the AM power supply 16 may include a switching power supply 60 and a linear power supply 62. The switching power supply 60 may provide high efficiency but have limited bandwidth, whereas the linear power supply 62 may provide greater bandwidth but have lower efficiency than the switching power supply 60. In an exemplary embodiment of the present invention, the bandwidth of the linear power supply 62 is at least two times the bandwidth of the switching power supply 60.

Figure 16:
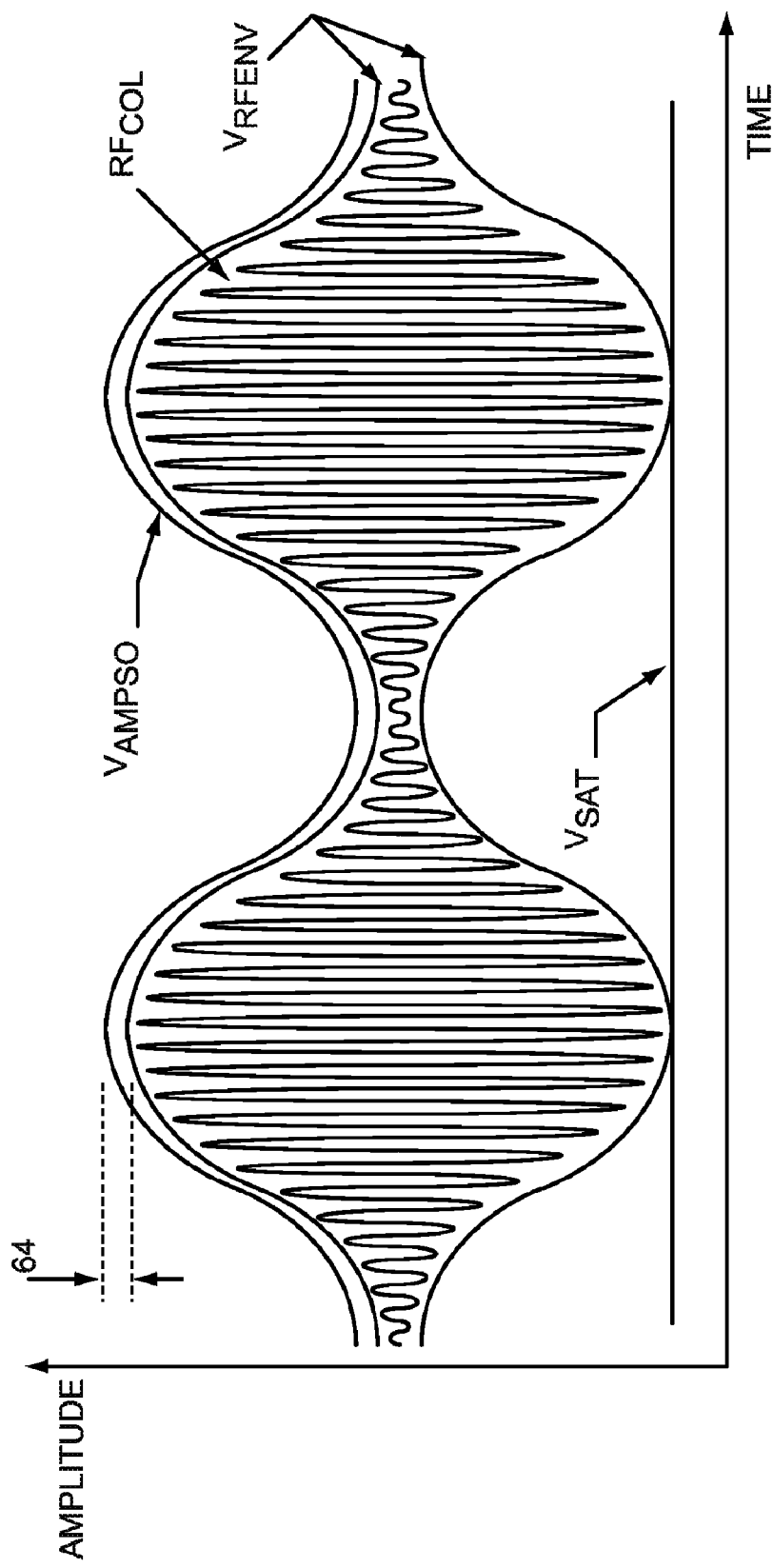
FIG. 16 is a graph illustrating the relationships between the AM power supply output signal and the AM RF collector signal illustrated in FIG. 13.

FIG. 16 is a graph illustrating the relationships between the AM power supply output signal $V_{AMPSO}$ and the AM RF collector signal $RF_{COL}$ that were illustrated in FIG. 13. The amplitude excursions of the AM RF collector signal $RF_{COL}$ define an RF envelope $V_{RFENV}$ having a top-half and a bottom-half. Typically, the frequency of the AM RF collector signal $RF_{COL}$ is much higher than the frequency of the RF envelope $V_{RFENV}$; however, a lower frequency AM RF collector signal $RF_{COL}$ is shown for clarity. Normally, the shape of either the top-half or the bottom-half of the RF envelope $V_{RFENV}$ follows the amplitude of the AM RF input signal $RF_{AM}$. The amplitude of the AM power supply output signal $V_{AMPSO}$ is normally greater than the corresponding amplitude of the RF envelope $V_{RFENV}$ by at least a minimum headroom 64.

If the excursions of the RF envelope $V_{RFENV}$ are such that an amplitude of the RF envelope $V_{RFENV}$ is greater than the minimum headroom 64 or less than a saturation voltage $V_{SAT}$ of the transistor element 50, then clipping, non-linearity, or other distortions of the AM RF collector signal $RF_{COL}$ may occur. Such clipping, non-linearity, or other distortions may cause clipping, non-linearity, or other distortions of the AM RF output signal $RF_{AMOUT}$. The pre-distortion of the AM signal $V_{AM}$ to provide the AM power supply input signal $V_{AMPSI}$ may substantially prevent non-linearity or other distortions of the AM RF output signal $RF_{AMOUT}$. In one embodiment of the present invention, the pre-distortion of the AM signal $V_{AM}$ to provide the AM power supply input signal $V_{AMPSI}$ may substantially prevent clipping of the AM RF output signal $RF_{AMOUT}$.

Figure 17:
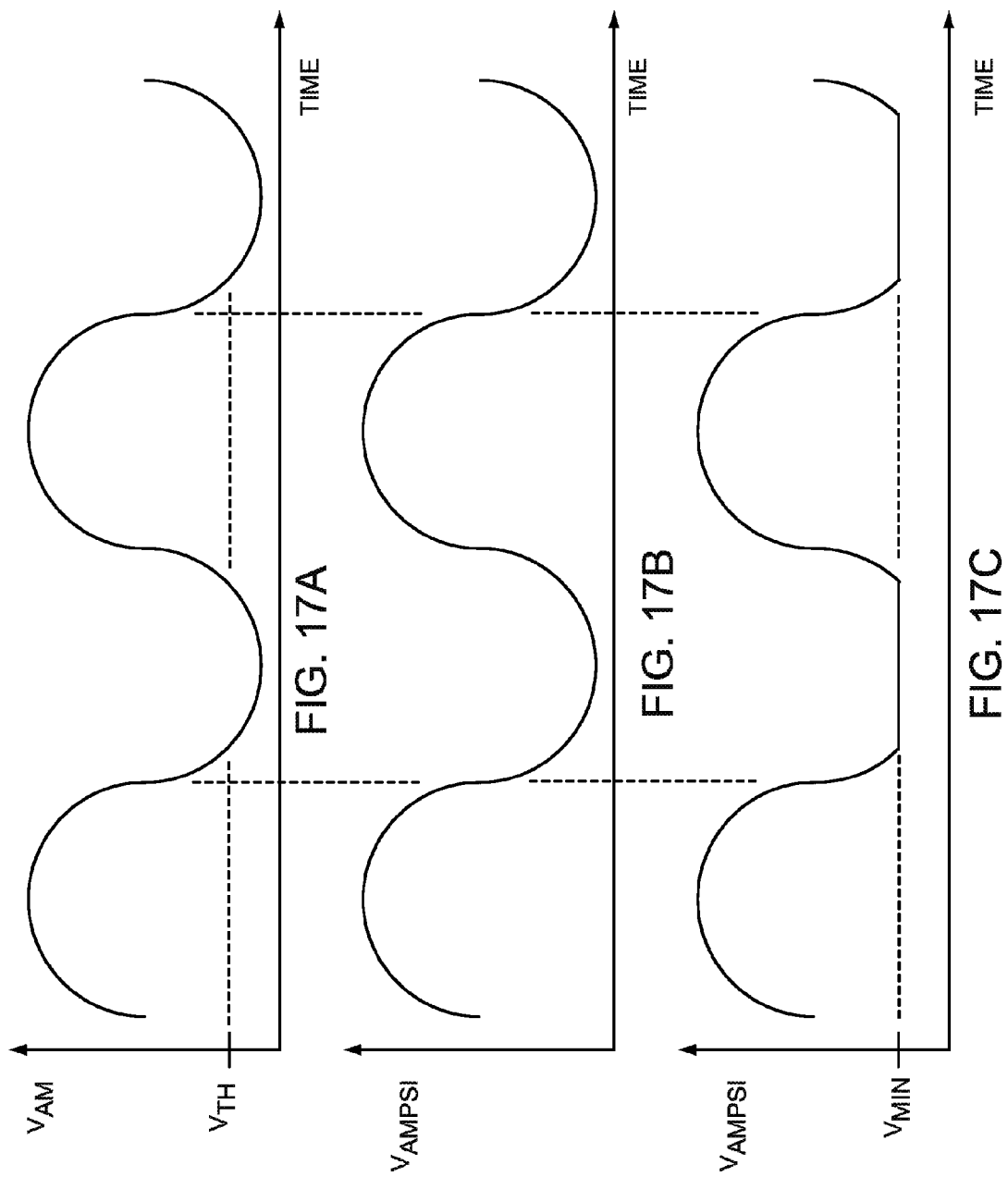

FIGS. 17A and 17B are graphs illustrating the AM signal $V_{AM}$ and the AM power supply input signal $V_{AMPSI}$, respectively, according to one embodiment of the present invention. The AM power supply input signal $V_{AMPSI}$ may generally tend to follow the AM signal $V_{AM}$ as illustrated. FIGS. 17A and 17C are graphs illustrating the AM signal $V_{AM}$ and the AM power supply input signal $V_{AMPSI}$, respectively, according to an alternate embodiment of the present invention. The AM power supply input signal $V_{AMPSI}$ may generally tend to follow the AM signal $V_{AM}$ until the magnitude of the AM signal $V_{AM}$ drops below a minimum threshold $V_{TH}$, wherein the AM power supply input signal $V_{AMPSI}$ is pre-distorted to a minimum value $V_{MIN}$ until the magnitude of the AM signal $V_{AM}$ increases above the minimum threshold $V_{TH}$. Since modulating the AM power supply input signal $V_{AMPSI}$ may modulate the gain of the PA stage 18, in some cases it may be desirable to hold the AM power supply input signal $V_{AMPSI}$ constant at low power levels.

Figure 18:
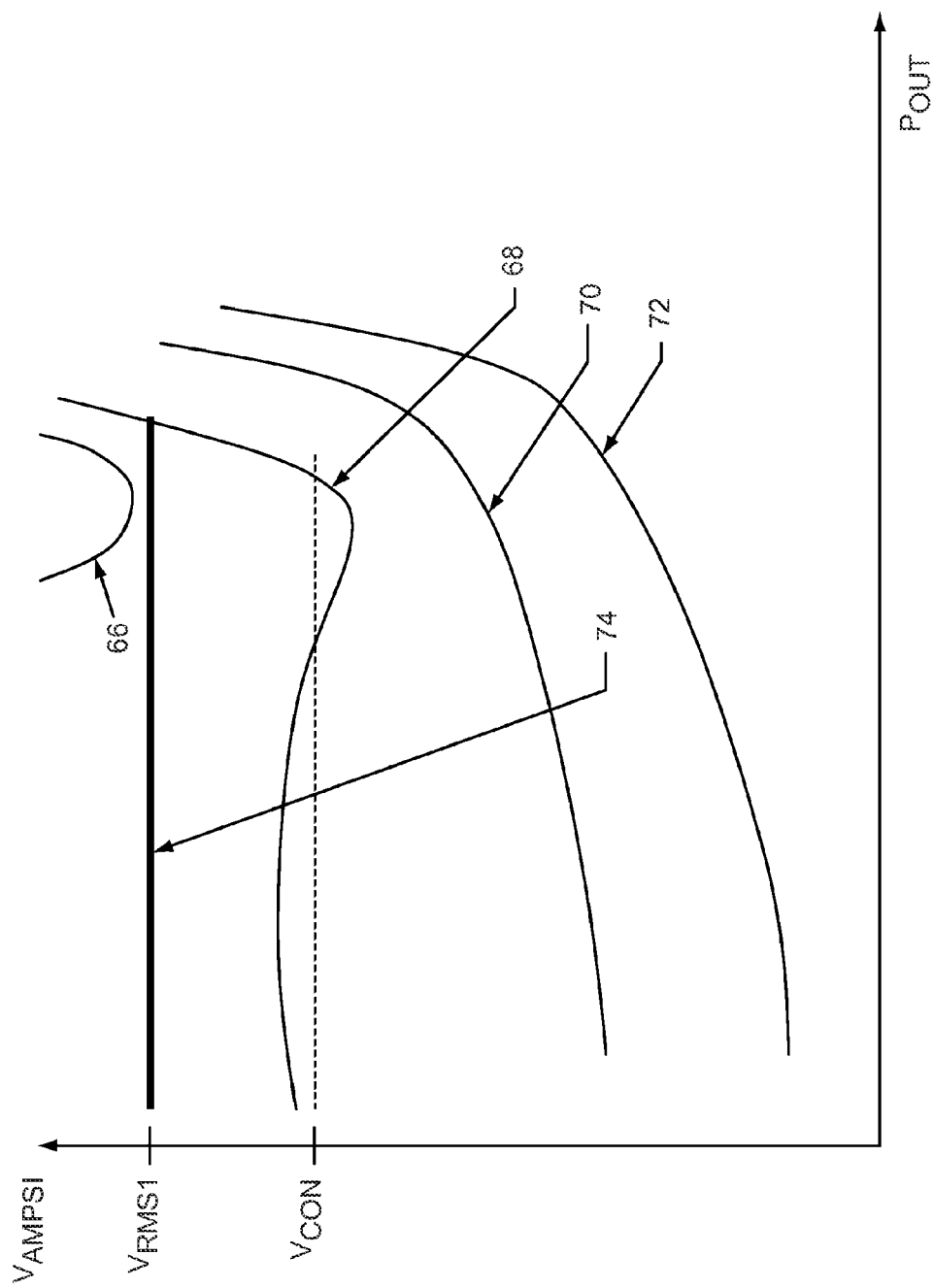
FIG. 18 is a graph illustrating how the gain of a PA stage relates to an output power of the PA stage when the AM power supply input signal is held constant.

FIG. 18 is a graph illustrating how the gain of the PA stage 18 relates to an output power $P_{OUT}$ of the PA stage 18 when the AM power supply input signal $V_{AMPSI}$ is held constant. As the PA stage 18 is amplitude modulated, the output power $P_{OUT}$ of the PA stage 18 varies with the amplitude modulation. Since modulating the AM power supply input signal $V_{AMPSI}$ may modulate the gain of the PA stage 18, the gain of the PA stage 18 may vary with the amplitude modulation. FIG. 18 shows a first iso-gain curve 66, a second iso-gain curve 68, a third iso-gain curve 70, and a fourth iso-gain curve 72. Each iso-gain curve 66, 68, 70, 72 illustrates an operating region, which corresponds to a constant gain of the PA stage 18.

When the magnitude of the AM power supply input signal $V_{AMPSI}$ is held at a constant value $V_{CON}$, the output power $P_{OUT}$ of the PA stage 18 varies as illustrated by the second iso-gain curve 68. At low power levels, the second iso-gain curve 68 is above the constant value $V_{CON}$, which is indicative of a decrease in gain, which is called gain compression. At middle power levels, the second iso-gain curve 68 is below the constant value $V_{CON}$, which is indicative of an increase in gain, which is called gain expansion. The gain compression and expansion can degrade linearity of the PA stage 18, which may cause violations of linearity constraints, such as adjacent channel leakage power ratio (ACLR) constraints. The AM power supply input signal $V_{AMPSI}$ may be held at a relatively high first root mean squared (RMS) value $V_{RMS1}$ for all values of the output power $P_{OUT}$ as shown by a constant AM power supply input signal $V_{AMPSI}$ curve 74, according to the prior art. However, operating under such conditions may be relatively inefficient.

Figure 19:
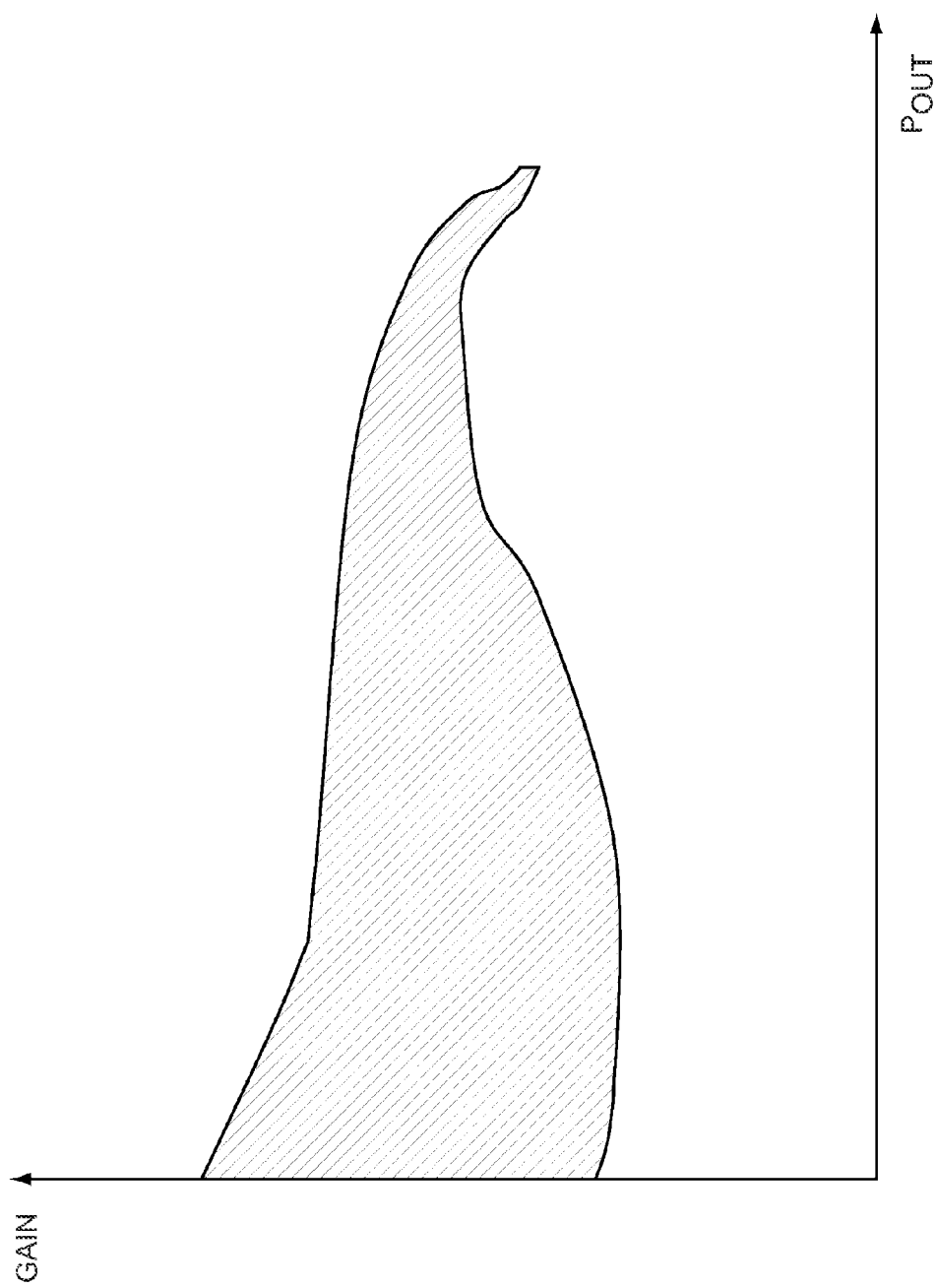
FIG. 19 is a graph illustrating how the instantaneous gain of a transmit chain relates to an ideal output power of the transmit chain when the AM power supply input signal is held constant and the transmit chain is transmitting a polar-modulated signal.

FIG. 19 is a graph illustrating how the instantaneous gain GAIN of a transmit chain relates to an ideal output power $P_{OUT}$ of the transmit chain when the AM power supply input signal $V_{AMPSI}$ is held constant and the transmit chain is transmitting a polar-modulated signal. Due to gain expansion and compression, for any ideal output power $P_{OUT}$, the instantaneous gain GAIN varies from a minimum to a maximum.

Figure 20:
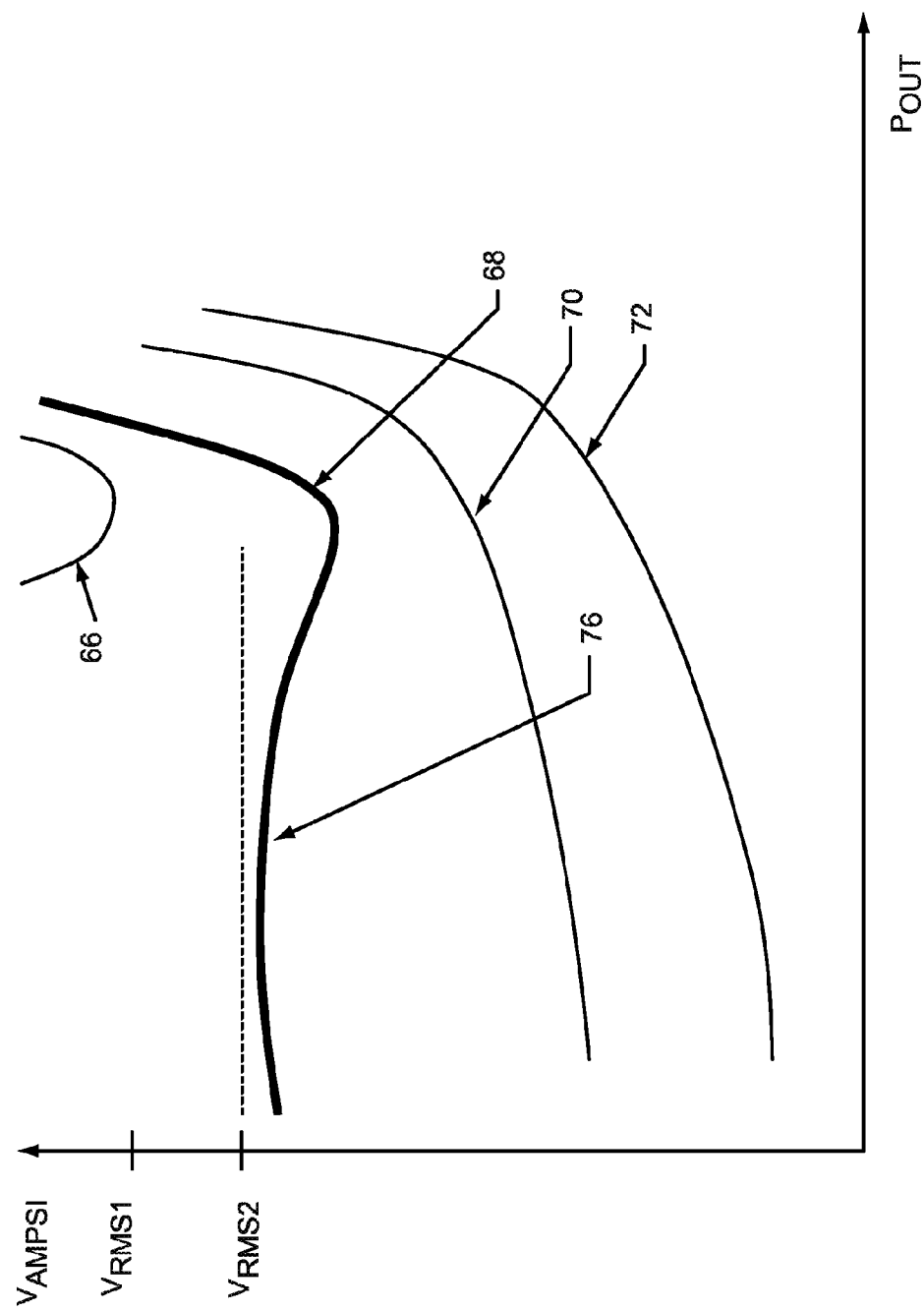
FIG. 20 is a graph illustrating how the magnitude of the AM power supply input signal relates to the output power of the PA stage, according to a first embodiment of the present invention.

FIG. 20 is a graph illustrating how the magnitude of the AM power supply input signal $V_{AMPSI}$ relates to the output power $P_{OUT}$ of the PA stage 18, according to a first embodiment of the present invention. The AM power supply input signal $V_{AMPSI}$ is pre-distorted to create a pre-distorted constant gain curve 76, which substantially maintains constant gain of the PA stage 18 by following an iso-gain curve 66, 68, 70, 72. A second RMS value $V_{RMS2}$ of the AM power supply input signal $V_{AMPSI}$ corresponds with the pre-distorted constant gain curve 76. The second RMS value $V_{RMS2}$ is less than the first RMS value $V_{RMS1}$, which may improve efficiency over some designs. However, by following an iso-gain curve 66, 68, 70, 72, gain expansion and contraction are avoided, thereby improving linearity.

Figure 21:
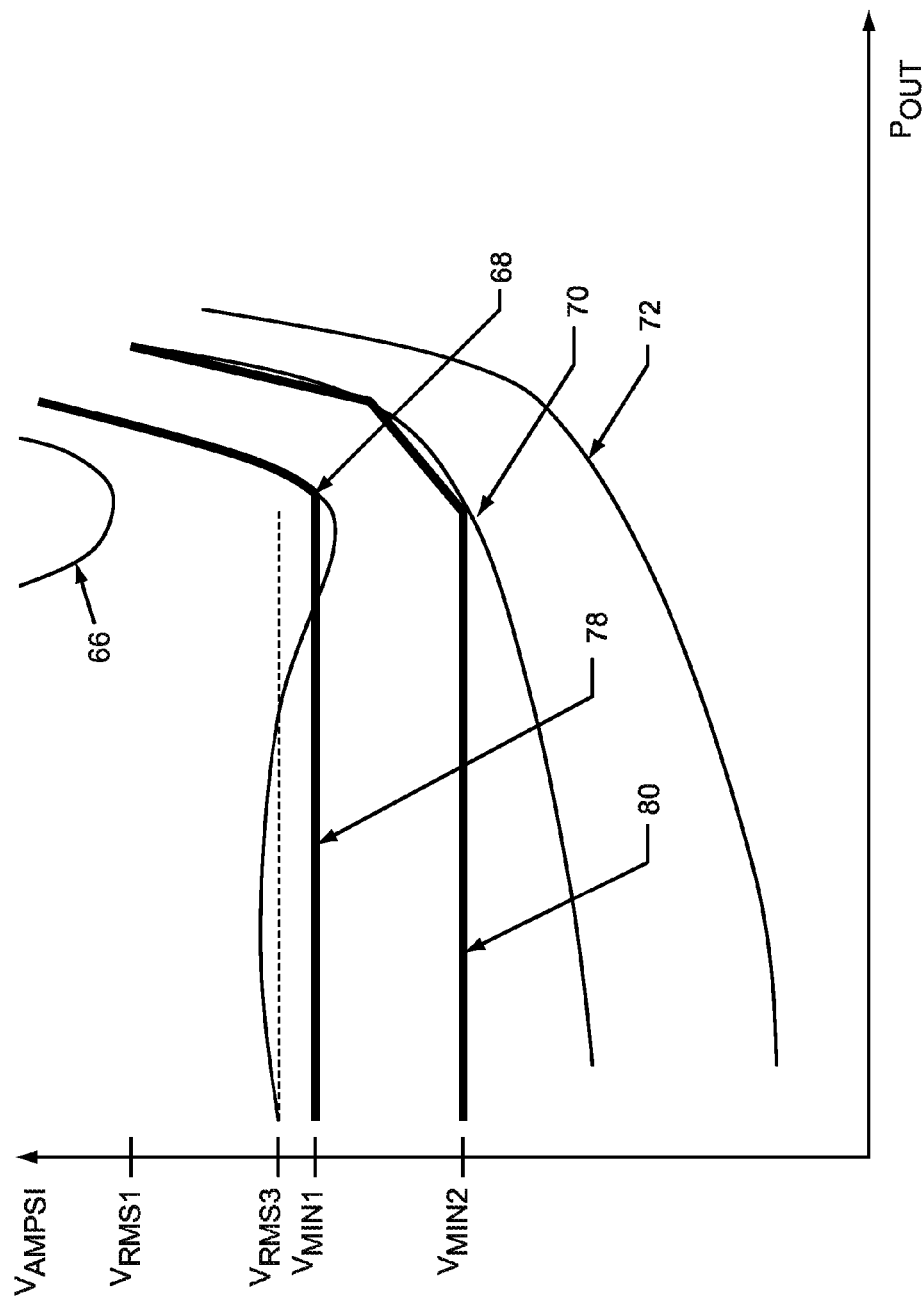
FIG. 21 is a graph illustrating how the magnitude of the AM power supply input signal relates to the output power of the PA stage, according to a second and a third embodiment of the present invention.

FIG. 21 is a graph illustrating how the magnitude of the AM power supply input signal $V_{AMPSI}$ relates to the output power $P_{OUT}$ of the PA stage, according to a second and a third embodiment of the present invention. In the second embodiment of the present invention, a first pre-distortion curve 78 illustrates pre-distortion of the AM power supply input signal $V_{AMPSI}$. When the magnitude of the AM signal $V_{AM}$ is above a first minimum threshold, the AM power supply input signal $V_{AMPSI}$ is pre-distorted to follow the second iso-gain curve 68. When the magnitude of the AM signal $V_{AM}$ is below the first minimum threshold, the AM power supply input signal $V_{AMPSI}$ is pre-distorted to a first minimum value $V_{MIN1}$. A third RMS value $V_{RMS3}$ of the AM power supply input signal $V_{AMPSI}$ corresponds with the first pre-distortion curve 78. The third RMS value $V_{RMS3}$ is less than the first RMS value $V_{RMS1}$, which improves efficiency. However, gain expansion and compression may still be present at low values of output power $P_{OUT}$.

The magnitude of the third RMS value $V_{RMS3}$ is less than the magnitude of the second RMS value $V_{RMS2}$; therefore, pre-distorting the AM power supply input signal $V_{AMPSI}$ using the first pre-distortion curve 78 improves the efficiency of the PA stage 18 compared to using the pre-distorted constant gain curve 76. However, using the first pre-distortion curve 78 may degrade the linearity of the PA stage 18. Therefore, there may be a trade-off between efficiency and linearity. In one embodiment of the present invention, pre-distortion of the AM power supply input signal $V_{AMPSI}$ improves efficiency, and pre-distortion of the pre-distorted gain-corrected AM signal $V_{AMGP}$ recovers some or all of any linearity lost due to the pre-distortion of the AM power supply input signal $V_{AMPSI}$.

In the third embodiment of the present invention, a second pre-distortion curve 80 illustrates pre-distortion of the AM power supply input signal $V_{AMPSI}$. When the magnitude of the AM signal $V_{AM}$ is above a second minimum threshold, the AM power supply input signal $V_{AMPSI}$ may be pre-distorted to increase efficiency. When the magnitude of the AM signal $V_{AM}$ is below the second minimum threshold and above a third minimum threshold, the AM power supply input signal $V_{AMPSI}$ may be further pre-distorted to increase efficiency. When the magnitude of the AM signal $V_{AM}$ is below the third minimum threshold, the AM power supply input signal $V_{AMPSI}$ is pre-distorted to a second minimum value $V_{MIN2}$.

In one embodiment of the present invention, the AM power supply input signal $V_{AMPSI}$ is pre-distorted to substantially maintain constant linearity of the PA stage 18. In an alternate embodiment of the present invention, the AM power supply input signal $V_{AMPSI}$ is pre-distorted to increase the average power efficiency of the PA stage 18 over using the AM power supply input signal $V_{AMPSI}$ without pre-distortion, while conforming to linearity constraints. The AM power supply input signal $V_{AMPSI}$ may be pre-distorted to maximize the average power efficiency of the PA stage 18 while conforming to linearity constraints. The linearity constraints may include maximum linearity error limits and linearity error margins, which may allow for environmental variations, aging, manufacturing variations, and the like. The linearity constraints may include adjacent channel leakage power ratio (ACLR) constraints, which may be associated with a wireless communications protocol.

Figure 22:
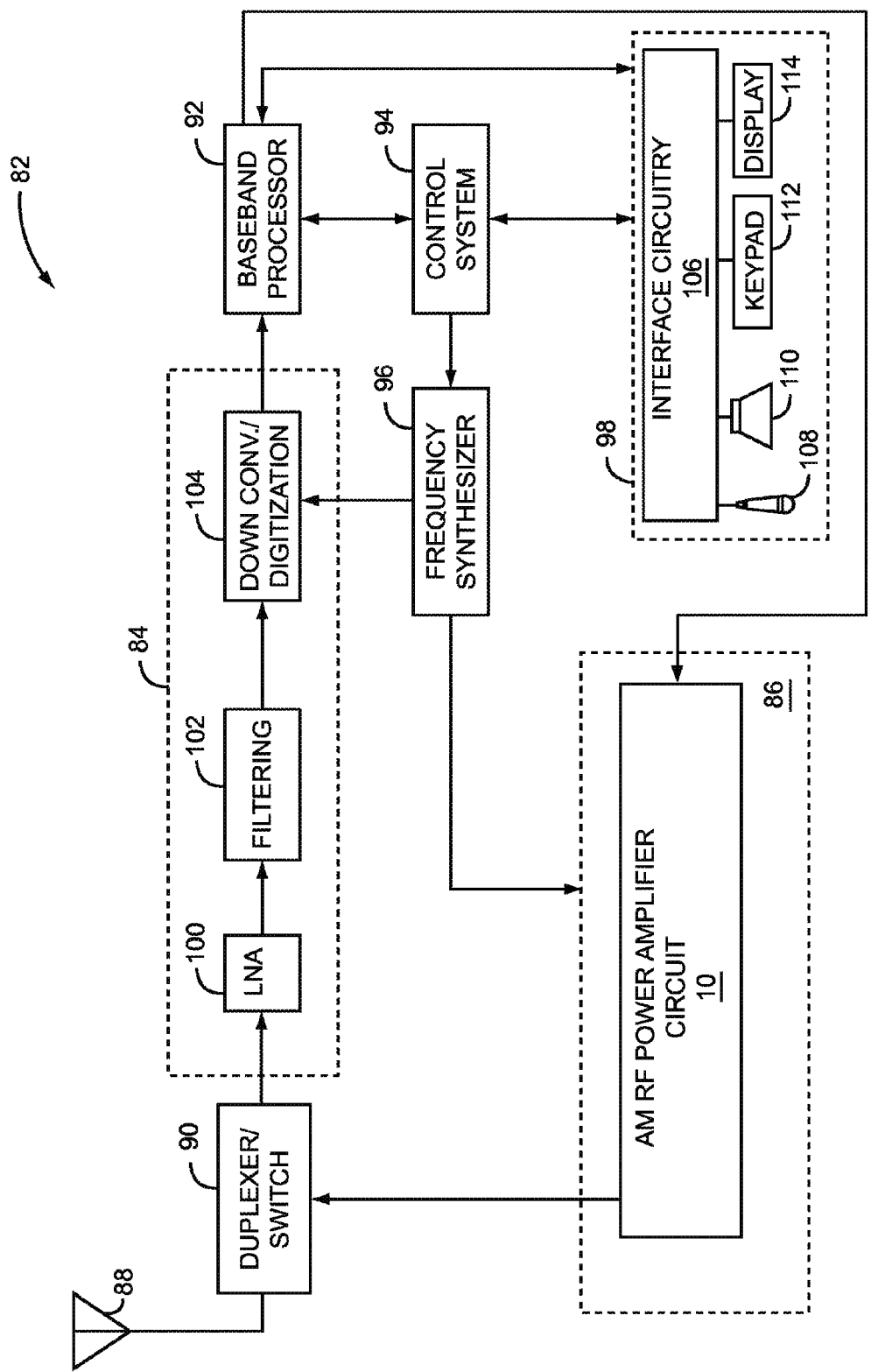
FIG. 22 shows an application example of the present invention used in a mobile terminal.

An application example of the amplitude-modulated RF power amplifier circuit 10 is its use in a mobile terminal 82, the basic architecture of which is represented in FIG. 22. The mobile terminal 82 may include a receiver front end 84, a radio frequency transmitter section 86, an antenna 88, a duplexer or switch 90, a baseband processor 92, a control system 94, a frequency synthesizer 96, and an interface 98. The receiver front end 84 receives information bearing radio frequency signals from one or more remote transmitters provided by a base station (not shown). A low noise amplifier (LNA) 100 amplifies the signal. A filter circuit 102 minimizes broadband interference in the received signal, while down conversion and digitization circuitry 104 down converts the filtered, received signal to an intermediate or baseband frequency signal, which is then digitized into one or more digital streams. The receiver front end 84 typically uses one or more mixing frequencies generated by the frequency synthesizer 96. The baseband processor 92 processes the digitized received signal to extract the information or data bits conveyed in the received signal. This processing typically comprises demodulation, decoding, and error correction operations. As such, the baseband processor 92 is generally implemented in one or more digital signal processors (DSPs).

On the transmit side, the baseband processor 92 receives digitized data, which may represent voice, data, or control information, from the control system 94, which it encodes for transmission. The encoded data is output to the radio frequency transmitter section 86 for transmission. The amplitude-modulated RF power amplifier circuit 10 amplifies the modulated carrier signal to a level appropriate for transmission, and delivers the amplified and modulated carrier signal to the antenna 88 through the duplexer or switch 90.

A user may interact with the mobile terminal 82 via the interface 98, which may include interface circuitry 106 associated with a microphone 108, a speaker 110, a keypad 112, and a display 114. The interface circuitry 106 typically includes analog-to-digital converters, digital-to-analog converters, amplifiers, and the like. Additionally, it may include a voice encoder/decoder, in which case it may communicate directly with the baseband processor 92. The microphone 108 will typically convert audio input, such as the user's voice, into an electrical signal, which is then digitized and passed directly or indirectly to the baseband processor 92. Audio information encoded in the received signal is recovered by the baseband processor 92, and converted by the interface circuitry 106 into an analog signal suitable for driving the speaker 110. The keypad 112 and display 114 enable the user to interact with the mobile terminal 82, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. An amplitude-modulated radio frequency (RF) power amplifier circuit comprising:
   a first amplitude modulation (AM) pre-distortion circuit adapted to:
      receive an AM signal; and
      pre-distort the AM signal to generate an amplitude-modulated power supply input signal;
   an AM power supply comprising a switching power supply and a linear power supply, the AM power supply adapted to:
      receive the amplitude-modulated power supply input signal; and
      provide an amplitude-modulated power supply output signal based on the amplitude-modulated power supply input signal; and
   a power amplifier stage adapted to:
      receive an amplitude-modulated RF input signal that is based on the AM signal;
      receive the amplitude-modulated power supply output signal to provide power for amplification; and amplify the amplitude-modulated RF input signal to provide an amplitude-modulated RF output signal.

2. The amplitude-modulated RF power amplifier circuit of claim 1 wherein:
the amplitude-modulated RF power amplifier circuit provides a polar-modulated RF power amplifier circuit;
the amplitude-modulated RF input signal comprises a polar-modulated RF input signal that is based on the AM signal and a phase modulation (PM) signal; and
the amplitude-modulated RF output signal comprises a polar-modulated RF output signal.

3. The amplitude-modulated RF power amplifier circuit of claim 1 wherein:
the amplitude-modulated RF input signal is a single-ended signal; and
the amplitude-modulated RF output signal is a single-ended signal.

4. The amplitude-modulated RF power amplifier circuit of claim 1 further comprising:
an AM modulation circuit adapted to:
receive a pre-distorted AM signal and a first RF signal; and
amplitude modulate the first RF signal based on the pre-distorted AM signal to provide the amplitude-modulated RF input signal; and
a second AM pre-distortion circuit adapted to:
receive the AM signal; and
pre-distort the AM signal to provide the pre-distorted AM signal.

5. The amplitude-modulated RF power amplifier circuit of claim 4 wherein:
the amplitude-modulated power supply input signal is pre-distorted to increase average power efficiency of the power amplifier stage over average power efficiency of the power amplifier stage based on the amplitude-modulated power supply input signal without pre-distortion; and
pre-distortion of the pre-distorted AM signal recovers at least part of any linearity lost due to the pre-distortion of the amplitude-modulated power supply input signal.

6. The amplitude-modulated RF power amplifier circuit of claim 1 further comprising:
an AM modulation circuit adapted to:
receive a gain-corrected AM signal and a first RF signal; and
amplitude modulate the first RF signal based on the gain-corrected AM signal to provide the amplitude-modulated RF input signal;
gain measurement circuitry adapted to:
receive the amplitude-modulated RF input signal;
receive the amplitude-modulated RF output signal;
determine gain of the power amplifier stage based on the amplitude-modulated RF input signal and the amplitude-modulated RF output signal; and
provide a power amplifier stage gain signal based on the gain; and
AM gain correction circuitry adapted to:
receive the AM signal and the power amplifier stage gain signal; and
provide the gain-corrected AM signal based on the AM signal and the power amplifier stage gain signal.

7. The amplitude-modulated RF power amplifier circuit of claim 1 further comprising:
an AM modulation circuit adapted to:
receive a pre-distorted gain-corrected AM signal and a first RF signal; and
amplitude modulate the first RF signal based on the pre-distorted gain-corrected AM signal to provide the amplitude-modulated RF input signal;
gain measurement circuitry adapted to:
receive the amplitude-modulated RF input signal;
receive the amplitude-modulated RF output signal;
determine gain of the power amplifier stage based on the amplitude-modulated RF input signal and the amplitude-modulated RF output signal; and
provide a power amplifier stage gain signal based on the gain;
AM gain correction circuitry adapted to:
receive the AM signal and the power amplifier stage gain signal; and
provide a gain-corrected AM signal based on the AM signal and the power amplifier stage gain signal; and
a second AM pre-distortion circuit adapted to:
receive the gain-corrected AM signal; and
pre-distort the gain-corrected AM signal to provide the pre-distorted gain-corrected AM signal.

8. The amplitude-modulated RF power amplifier circuit of claim 7 wherein the second AM pre-distortion circuit is further adapted to receive the power amplifier stage gain signal and the pre-distorted gain-corrected AM signal is further based on the power amplifier stage gain signal.

9. The amplitude-modulated RF power amplifier circuit of claim 7 wherein the pre-distorted gain-corrected AM signal provides soft-clipping of the amplitude-modulated RF input signal.

10. The amplitude-modulated RF power amplifier circuit of claim 1 wherein a bandwidth of the linear power supply is greater than a bandwidth of the switching power supply.

11. The amplitude-modulated RF power amplifier circuit of claim 1 wherein a bandwidth of the AM signal is greater than a bandwidth of the amplitude-modulated power supply input signal.

12. The amplitude-modulated RF power amplifier circuit of claim 11 wherein the bandwidth of the AM signal is at least two times the bandwidth of the amplitude-modulated power supply input signal.

13. The amplitude-modulated RF power amplifier circuit of claim 1 wherein the amplitude-modulated power supply input signal is pre-distorted to a minimum value when a magnitude of the AM signal is below a minimum threshold.

14. The amplitude-modulated RF power amplifier circuit of claim 1 wherein the amplitude-modulated power supply input signal is pre-distorted to substantially prevent clipping of the amplitude-modulated RF output signal.

15. The amplitude-modulated RF power amplifier circuit of claim 1 wherein the amplitude-modulated power supply input signal is pre-distorted to substantially maintain constant gain in the power amplifier stage.

16. The amplitude-modulated RF power amplifier circuit of claim 1 wherein the amplitude-modulated power supply input signal is pre-distorted to substantially maintain constant linearity in the power amplifier stage.

17. The amplitude-modulated RF power amplifier circuit of claim 1 wherein the amplitude-modulated power supply input signal is pre-distorted to increase average power efficiency of the power amplifier stage:
over the average power efficiency of the power amplifier stage based on the amplitude-modulated power supply input signal without pre-distortion; and
while conforming to linearity constraints.

18. The amplitude-modulated RF power amplifier circuit of claim 17 wherein the amplitude-modulated power supply input signal is pre-distorted to maximize the average power efficiency of the power amplifier stage.

19. The amplitude-modulated RF power amplifier circuit of claim 18 wherein the linearity constraints comprise maximum linearity error limits and linearity error margins.

20. The amplitude-modulated RF power amplifier circuit of claim 17 wherein the linearity constraints comprise adjacent channel leakage power ratio (ACLR) constraints.

21. The amplitude-modulated RF power amplifier circuit of claim 1 further comprising:
   an AM modulation circuit adapted to:
      receive a gain-corrected AM signal and a first RF signal; and
      amplitude modulate the first RF signal based on the gain-corrected AM signal to provide the amplitude-modulated RF input signal;
   gain measurement circuitry adapted to:
      receive the AM signal;
      receive the amplitude-modulated RF output signal;
      determine gain of the power amplifier stage based on the AM signal and the amplitude-modulated RF output signal; and
      provide a power amplifier stage gain signal based on the gain; and
   AM gain correction circuitry adapted to:
      receive the AM signal and the power amplifier stage gain signal; and
      provide the gain-corrected AM signal based on the AM signal and the power amplifier stage gain signal.

22. The amplitude-modulated RF power amplifier circuit of claim 1 further comprising:
   an AM modulation circuit adapted to:
      receive a pre-distorted gain-corrected AM signal and a first RF signal; and
      amplitude modulate the first RF signal based on the pre-distorted gain-corrected AM signal to provide the amplitude-modulated RF input signal;
   gain measurement circuitry adapted to:
      receive the AM signal;
      receive the amplitude-modulated RF output signal;
      determine gain of the power amplifier stage based on the AM signal and the amplitude-modulated RF output signal; and
      provide a power amplifier stage gain signal based on the gain;
   AM gain correction circuitry adapted to:
      receive the AM signal and the power amplifier stage gain signal; and
      provide a gain-corrected AM signal based on the AM signal and the power amplifier stage gain signal; and
   a second AM pre-distortion circuit adapted to:
      receive the gain-corrected AM signal; and
      pre-distort the gain-corrected AM signal to provide the pre-distorted gain-corrected AM signal.

23. The amplitude-modulated RF power amplifier circuit of claim 1 wherein the amplitude-modulated power supply input signal is based on at least one of values extracted from a look-up table and interpolation between values in the look-up table.

24. The amplitude-modulated RF power amplifier circuit of claim 23 wherein:
   the look-up table comprises a plurality of sub look-up tables;
   the first AM pre-distortion circuit is further adapted to select one of the plurality of sub look-up tables based on a target output power of the power amplifier stage; and
   the selected one of the plurality of sub look-up tables comprises the values extracted from the look-up table and the values in the look-up table.

25. The amplitude-modulated RF power amplifier circuit of claim 24 wherein the first AM pre-distortion circuit is further adapted to switch the selected one of the plurality of sub look-up tables using a digital ramp.

26. An amplitude-modulated radio frequency (RF) power amplifier circuit comprising:
   a first amplitude modulation (AM) pre-distortion circuit adapted to:
      receive an AM signal; and
      pre-distort the AM signal to provide an amplitude-modulated power supply input signal;
   an AM power supply adapted to:
      receive the amplitude-modulated power supply input signal; and
      provide an amplitude-modulated power supply output signal based on the amplitude-modulated power supply input signal; and
   a power amplifier stage adapted to:
      receive an amplitude-modulated RF input signal that is based on the AM signal;
      receive the amplitude-modulated power supply output signal to provide power for amplification;
      amplify the amplitude-modulated RF input signal to provide an amplitude-modulated RF output signal; and
   wherein:
   the amplitude-modulated RF power amplifier circuit provides an amplitude-modulated quadrature RF power amplifier circuit;
   the amplitude-modulated RF input signal comprises:
      an in-phase amplitude-modulated RF input signal; and
      a quadrature-phase amplitude-modulated RF input signal;
   the amplitude-modulated RF output signal comprises:
      an in-phase amplitude-modulated RF output signal; and
      a quadrature-phase amplitude-modulated RF output signal; and
   the power amplifier stage comprises:
      an in-phase power amplifier stage adapted to:
         receive the in-phase amplitude-modulated RF input signal that is based on the AM signal;
         receive the amplitude-modulated power supply output signal to provide power for amplification; and
         amplify the in-phase amplitude-modulated RF input signal to provide the in-phase amplitude-modulated RF output signal; and
      a quadrature-phase power amplifier stage adapted to:
         receive the quadrature-phase amplitude-modulated RF input signal that is based on the AM signal;
         receive the amplitude-modulated power supply output signal to provide power for amplification; and
         amplify the quadrature-phase amplitude-modulated RF input signal to provide the quadrature-phase amplitude-modulated RF output signal.

27. The amplitude-modulated RF power amplifier circuit of claim 26 wherein the AM power supply comprises a switching power supply.

28. The amplitude-modulated RF power amplifier circuit of claim 27 wherein the AM power supply further comprises a linear power supply.

29. An amplitude-modulated radio frequency (RF) power amplifier circuit comprising:
   a first amplitude modulation (AM) pre-distortion circuit adapted to:

receive an AM signal; and
pre-distort the AM signal to generate an amplitude-modulated power supply input signal;
an AM power supply adapted to:
receive the amplitude-modulated power supply input signal; and
provide an amplitude-modulated power supply output signal based on the amplitude-modulated power supply input signal; and
a power amplifier stage adapted to:
receive an amplitude-modulated RF input signal that is based on the AM signal;
receive the amplitude-modulated power supply output signal to provide power for amplification;
amplify the amplitude-modulated RF input signal to provide an amplitude-modulated RF output signal; and
wherein:
the amplitude-modulated RF power amplifier circuit provides a polar-modulated quadrature RF power amplifier circuit;
the amplitude-modulated RF input signal comprises:
an in-phase polar-modulated RF input signal; and
a quadrature-phase polar-modulated RF input signal;
the amplitude-modulated RF output signal comprises:
an in-phase polar-modulated RF output signal; and
a quadrature-phase polar-modulated RF output signal; and
the power amplifier stage comprises:
an in-phase power amplifier stage adapted to:
receive the in-phase polar-modulated RF input signal that is based on the AM signal and a phase modulation (PM) signal;
receive the amplitude-modulated power supply output signal to provide power for amplification; and
amplify the in-phase polar-modulated RF input signal to provide the in-phase polar-modulated RF output signal; and
a quadrature-phase power amplifier stage adapted to:
receive the quadrature-phase polar-modulated RF input signal that is based on the AM signal and the PM signal;
receive the amplitude-modulated power supply output signal to provide power for amplification; and
amplify the quadrature-phase polar-modulated RF input signal to provide the quadrature-phase polar-modulated RF output signal.

30. A method comprising:
receiving an amplitude modulation (AM) signal;
pre-distorting the AM signal to provide an amplitude-modulated power supply input signal;
receiving the amplitude-modulated power supply input signal;
generating an amplitude-modulated power output with an AM power supply based on the amplitude-modulated power supply input signal, wherein the AM power supply comprises a switching power supply and a linear supply;
receiving an amplitude-modulated RF input signal that is based on the AM signal;
receiving the amplitude-modulated power supply output signal to provide power for amplification; and
amplifying the amplitude-modulated RF input signal to provide an amplitude-modulated RF output signal.

* * * * *